US 7,343,511 B2

(12) United States Patent
Watanabe

(10) Patent No.: US 7,343,511 B2
(45) Date of Patent: Mar. 11, 2008

(54) METHOD AND APPARATUS FOR DATA TRANSFER, IMAGE FORMING APPARATUS, AND COMPUTER PRODUCT

(75) Inventor: Hideyuki Watanabe, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 391 days.

(21) Appl. No.: 10/885,624

(22) Filed: Jul. 8, 2004

(65) Prior Publication Data
US 2005/0108592 A1 May 19, 2005

(30) Foreign Application Priority Data

| Jul. 8, 2003 | (JP) | ............................. 2003-193703 |
| Mar. 18, 2004 | (JP) | ............................. 2004-079147 |
| Jul. 6, 2004 | (JP) | ............................. 2004-199439 |

(51) Int. Cl.
*G06F 1/04* (2006.01)
(52) U.S. Cl. ...................... 713/600; 713/500
(58) Field of Classification Search ................. 713/500, 713/600
See application file for complete search history.

(56) References Cited

U.S. PATENT DOCUMENTS 4,841,549 A * 6/1989 Knapp ........................ 375/362

| 4,944,023 | A | 7/1990 | Imao et al. |
| 5,589,954 | A | 12/1996 | Watanabe |
| 5,712,930 | A | 1/1998 | Watanabe |
| 6,687,829 | B1 | 2/2004 | Miyamoto et al. |
| 6,801,329 | B1 | 10/2004 | Urabe et al. |
| 2001/0023468 | A1 * | 9/2001 | Oh .............................. 710/129 |
| 2002/0169922 | A1 * | 11/2002 | Thomann et al. ........... 711/100 |
| 2003/0090953 | A1 * | 5/2003 | Kawai et al. ................ 365/233 |

FOREIGN PATENT DOCUMENTS

JP      5-108563      4/1993

* cited by examiner

*Primary Examiner*—Rehana Perveen
(74) *Attorney, Agent, or Firm*—Oblon, Spivak, McClelland, Maier & Neustadt, P.C.

(57) ABSTRACT

In a data transfer apparatus a clock transmitting unit transmits a first clock to a target for data transfer that is situated at a distance from the data transfer apparatus, a data transmitting unit in synchronization with the first clock transmits data including a start signal to the target; a response receiving unit receives from the target a response having therein the start signal and outputs a first response based on the response received; a clock generating unit receives the first clock and generates a second clock based on the first clock; a response generating unit in synchronization with the second clock generates a second response based on the first response; and a selector selects any one of the first response and the second response depending on the distance.

34 Claims, 22 Drawing Sheets

DATA TRANSFER APPARATUS

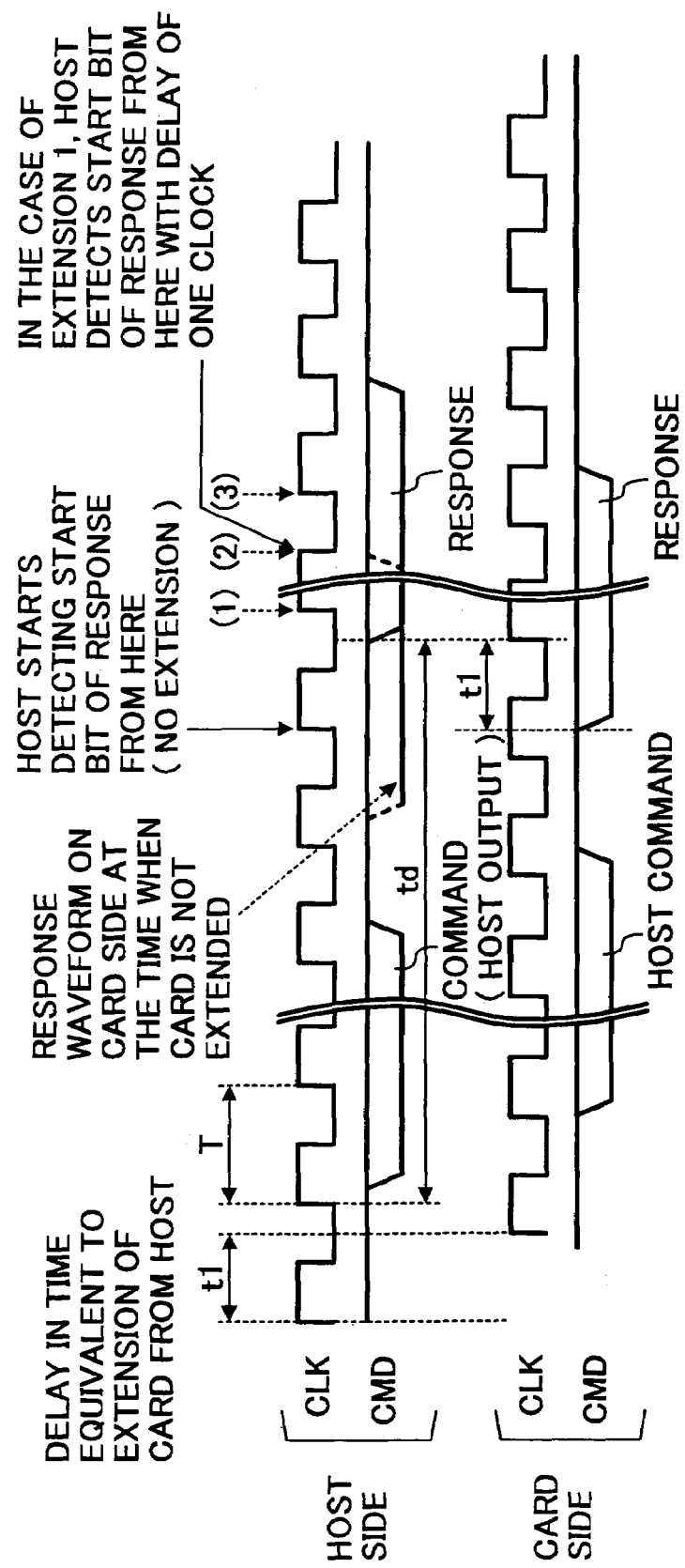

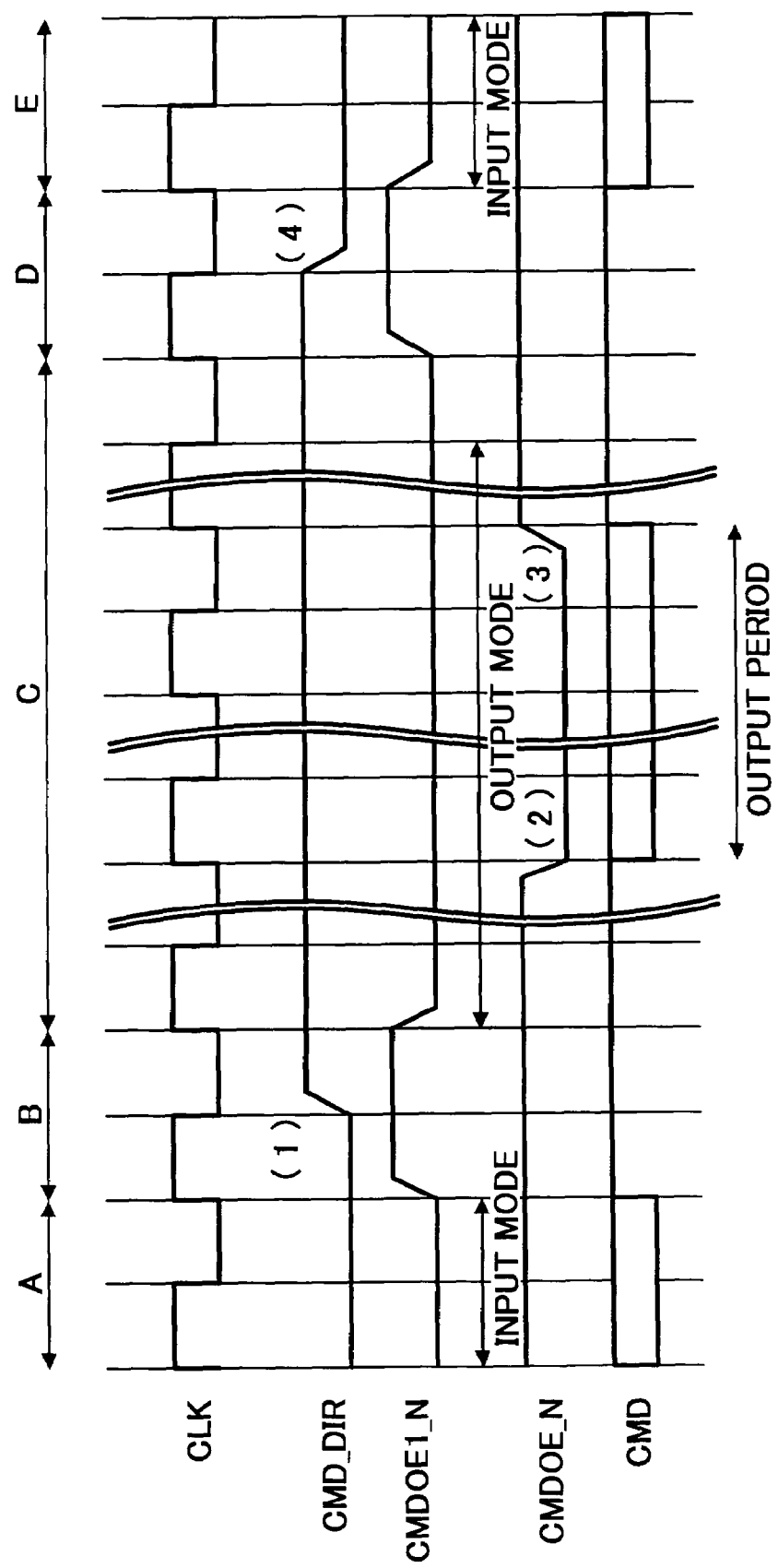

METHOD AND APPARATUS FOR DATA TRANSFER, IMAGE FORMING APPARATUS, AND COMPUTER PRODUCT

CROSS-REFERENCE TO RELATED APPLICATIONS

The present document incorporates by reference the entire contents of Japanese priority documents, 2003-193703 filed in Japan on Jul. 8, 2003, and 2004-079147 filed in Japan on Mar. 18, 2004, and 2004-199439 filed in Japan on Jul. 6, 2004.

BACKGROUND OF THE INVENTION

1) Field of the Invention

The present invention relates to a technology to perform data transfer between a data transfer apparatus and a target device such as a memory card, particularly, when the data transfer apparatus and the target device are situated away from each other.

2) Description of the Related Art

A conventional technique of this type has been disclosed in Japanese Patent Application Laid-Open Publication No. H5-108563. What is disclosed in this literature is a common clock bus that supplies a clock signal from a host device of an electronic apparatus to plural subordinate devices and a backward path common data bus that transfers a data signal output by each subordinate device, which has received a data signal sent by the host device, to the host device in synchronization with the clock signal. The backward path common data bus is extended from the subordinate device, which is located at a most remote end from the host device, among the subordinate devices connected to the backward path common data bus to directly connect the subordinate device to the host device, whereby a delay time of a data signal from each subordinate device with respect to the clock signal is fixed without depending on a position of the subordinate device.

However, the data transfer between the host device and the subordinate devices in the above literature is one-way transfer rather than two-way transfer. Transfer from the host device to the subordinate devices and transfer from the subordinate devices to the host device are performed via separate circuits, respectively. Therefore, wiring, numbers of both bus drive circuits and bus reception circuits corresponding to the transfer are required. This inevitably results in not only an increase wiring and the numbers of both bus drive circuits and the bus reception circuits.

When the host device and the subordinate devices are separated from each other, in other words, when the subordinate devices are provided at a distance from the host device, a CLK and a command are transferred to the subordinate devices with a delay in time equivalent to the distance between them. In addition, when the subordinate devices return responses to the host device, the responses arrive at the host device with a further delay in time. If the distance is small, the delay is not significant. However, if the distance is long, the delay becomes significant and sometimes the host device cannot receive responses from the subordinate devices, and transfer failure occurs.

SUMMARY OF THE INVENTION

It is an object of the present invention to solve at least the problems in the conventional technology.

A data transfer apparatus according to an aspect of the present invention includes a clock transmitting unit that transmits a first clock to a target for data transfer that is situated at a distance from the data transfer apparatus; a data transmitting unit that in synchronization with the first clock transmits data including a start signal to the target; a response receiving unit that receives from the target a response having therein the start signal and outputs a first response based on the response received; a clock generating unit that receives the first clock and generates a second clock based on the first clock; a response generating unit that in synchronization with the second clock generates a second response based on the first response; and a selector that selects any one of the first response and the second response depending on the distance.

A data transfer apparatus according to another aspect of the present invention includes a clock transmitting unit that transmits a first clock to a target for data transfer; a data transmitting unit that in synchronization with the first clock transmits data including a start signal to the target; a response receiving unit that receives from the target a response having therein the start signal and outputs a first response based on the response received; a clock generating unit that receives the first clock and generates a second clock based on the first clock; a response generating unit that in synchronization with the second clock generates a second response based on the first response; and a selector that selects any one of the first response and the second response depending on a time from transmission of the data by the data transmitting unit to the target until arrival of a response from the target at the response receiving unit.

A data transfer method according to still another aspect of the present invention includes transmitting, in synchronization with a first clock, data including a start signal to a target for data transfer that is situated at a distance from the data transfer apparatus; receiving from the target a response having therein the start signal and outputting a first response based on the response received; generating a second clock based on the first clock; generating, in synchronization with the second clock, a second response based on the first response; and selecting any one of the first response and the second response depending on the distance.

A data transfer method according to still another aspect of the present invention includes transmitting, in synchronization with a first clock, data including a start signal to a target for data transfer; receiving from the target a response having therein the start signal and outputting a first response based on the response received; generating a second clock based on the first clock; generating, in synchronization with the second clock, a second response based on the first response; and selecting any one of the first response and the second response depending on a time from transmission of the data in the transmitting until reception of the response at the receiving.

An image forming apparatus according to still another aspect of the present invention includes the above data transfer apparatus.

A computer program according to still another aspect of the present invention realizes the above method on a computer.

A computer-readable recording medium according to still another aspect of the present invention stores therein the above computer program.

The other objects, features, and advantages of the present invention are specifically set forth in or will become apparent from the following detailed description of the invention when read in conjunction with the accompanying drawings.

BRIEF DESCRIPTION OF THE DRAWINGS

FIGS. 5A to 5C are timing charts for explaining relations between commands and responses on a host side and a target (card) side in this embodiment;

FIG. 11 is a timing chart for explaining control timing for a first two-way buffer control unit in FIG. 10;

DETAILED DESCRIPTION

Exemplary embodiments of a method and apparatus for data transfer, an image forming apparatus, and a computer product according to the present invention will be hereinafter explained with reference to the accompanying drawings.

Figure 1:
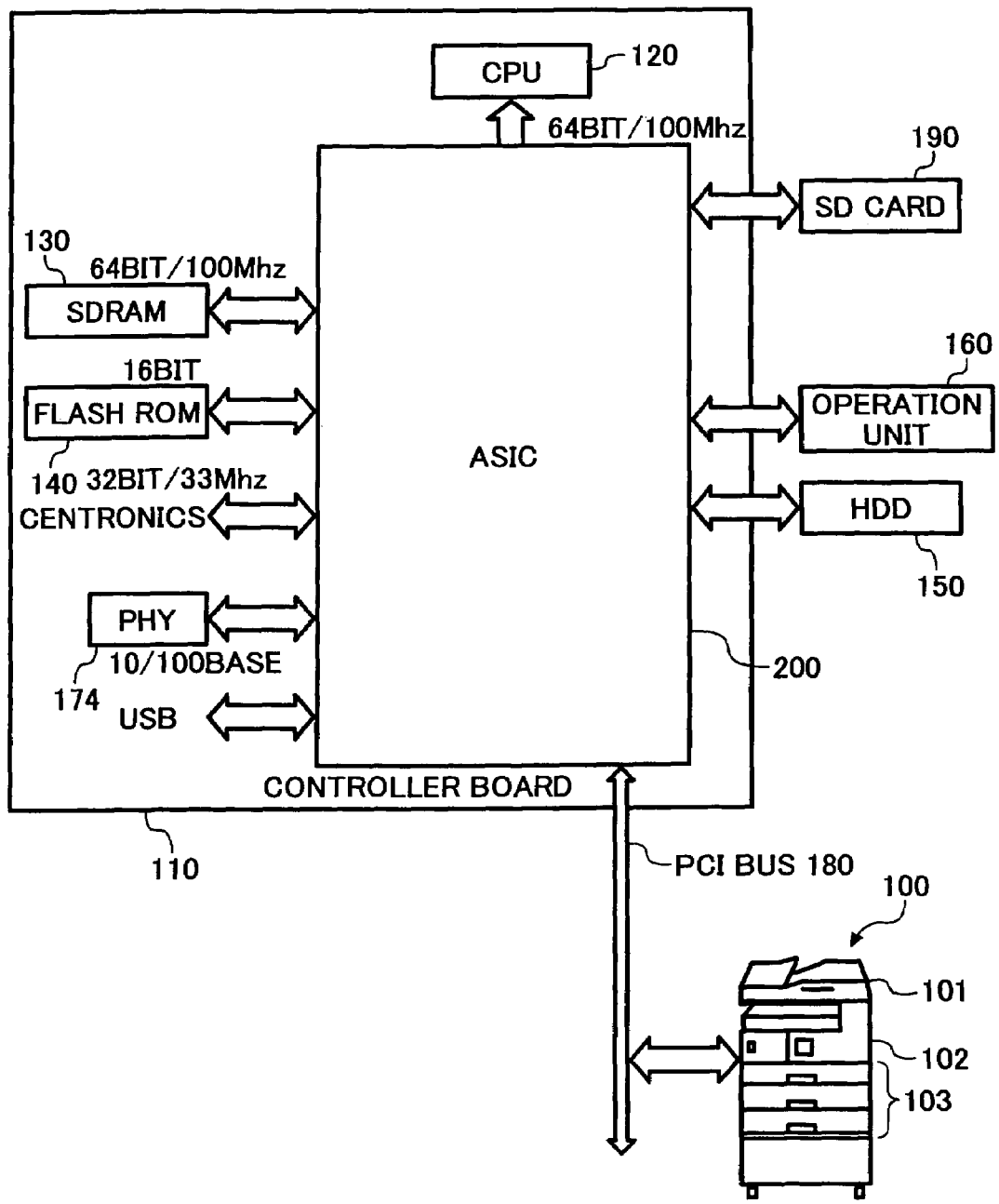
FIG. 1 is a schematic of an overall structure of a multi function peripheral (MFP) according to a first embodiment of the present invention.
Figure 2:
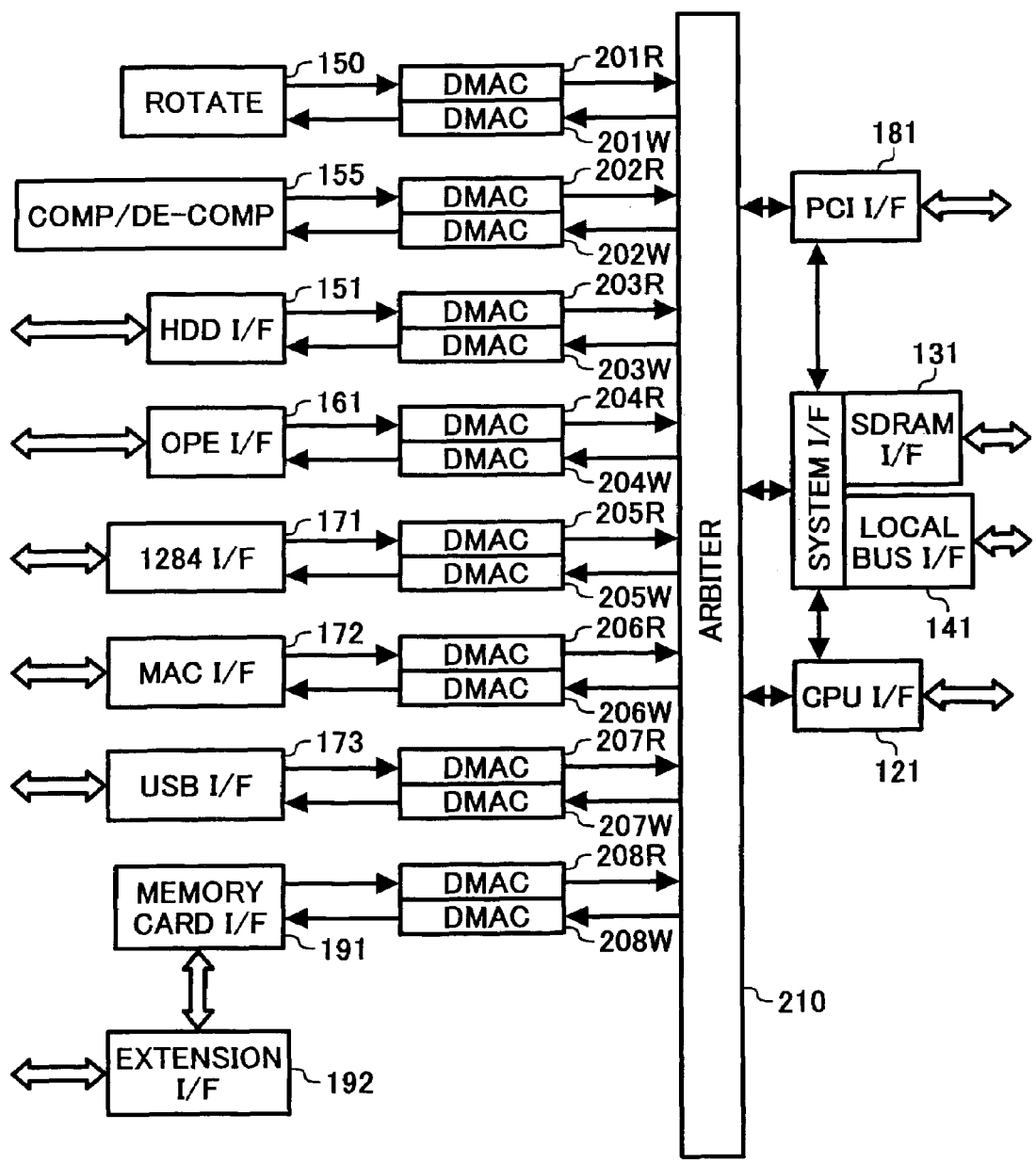
FIG. 2 is a block diagram of an internal structure of an ASIC of a data transfer apparatus mounted on a controller board of the MFP shown in FIG. 1.

FIG. 1 is a diagram of an overall structure of a multi function peripheral (MFP) according to an embodiment of the invention. FIG. 2 is a block diagram of an internal structure of an ASIC of a data transfer apparatus mounted on a controller board of the MFP shown in FIG. 1.

The data transfer apparatus is mounted on a controller board 110 of a MFP 100. The controller board 110 includes an ASIC 200, a nonvolatile Flash ROM 140 having programs and data stored therein, a memory (SDRAM) 130, a CPU 120 that is capable of executing computer programs on the Flash ROM 140 or the memory (SDRAM) 130, and a PCI I/F 181. The controller board 110 further includes a CPU I/F 121 that is connectable with the CPU 120, a memory I/F 131 that is connectable with the SDRAM 130, a Local Bus I/F 141 that is connectable with the Flash ROM 140, a HDD I/F 151 that is connectable with a HDD 150, an OPE I/F 161 that is connectable with an operation unit 160, and communication I/Fs 171, 172, and 173. The communication I/Fs consist of a Centronics I/F 171, a memory access controller interface (MAC I/F) 172, and a USB I/F 173. A PHY 174 is connected to the MAC I/F 172 to make it possible to connect the controller board 110 to a network. The controller board 110 is also connected to a PCI Bus 180 via the PCI I/F 181. Note that, in this embodiment, an example of the memory I/F 131 that connects the controller board 110 to the SDRAM 130 is described. However, if other memory I/Fs are mounted, it is possible to connect other memories to the controller board 110. Operations for the MFP 100 are performed via the operation unit 160, and computer programs and data can be stored in the HDD 150. Moreover, the controller board 110 includes a memory card (SD memory) I/F 191 to make it possible to connect the controller board 110 to a memory card (SD card) 190 as well.

In the controller board 110, it is possible to convert print data from the communication I/Fs 171, 172, and 173 into a format printable in the MFP 100, transfer the print data to the MFP 100 through the PCI Bus 180, and print an image in the MFP 100. It is also possible to store an image from a scanner 101 of the MFP 100 in the HDD 150 through the PCI Bus 180. Note that, in the MFP 100, an engine unit (image forming apparatus) 102 is provided below the scanner 101, and a sheet feeding apparatus 103 consisting of three sheet feeding stages is provided below the engine unit 102.

As shown in FIG. 2, in the ASIC 200, pairs of DMACs 201R and 201W, 202R and 202W, 203R and 203W, 204R and 204W, 205R and 205W, 206R and 206W, 207R and 207W, and 208R and 208W are connected to a Rotate 156, a compression/decompression unit (Comp/De-comp) 155, the HDD I/F 151, the OPE I/F 161, the Centronics I/F 171, the MAC I/F 172, and the USB I/F 173, which serve serving as communication I/Fs, and the memory card I/F 191, respectively. All of the DMACs are used for memory read and memory write (those with a sign R is for read, and those with a sign W is for write). The pairs of DMACs are connected to an arbiter 210. An access order for the DMACs is determined according to setting of priorities by the arbiter 210. In addition, the Rotate 156 is provided with a function of rotating an image in a memory, and the Comp/De-comp 155 is provided with a function of compressing and decompressing the image in the memory. The Rotate 156 and the Comp/De-comp 155 access the image through the arbiter 210.

An extension I/F 192 is connected to the memory card (SD card) 191 to make possible the communications from a more remote location.

Figure 3A:
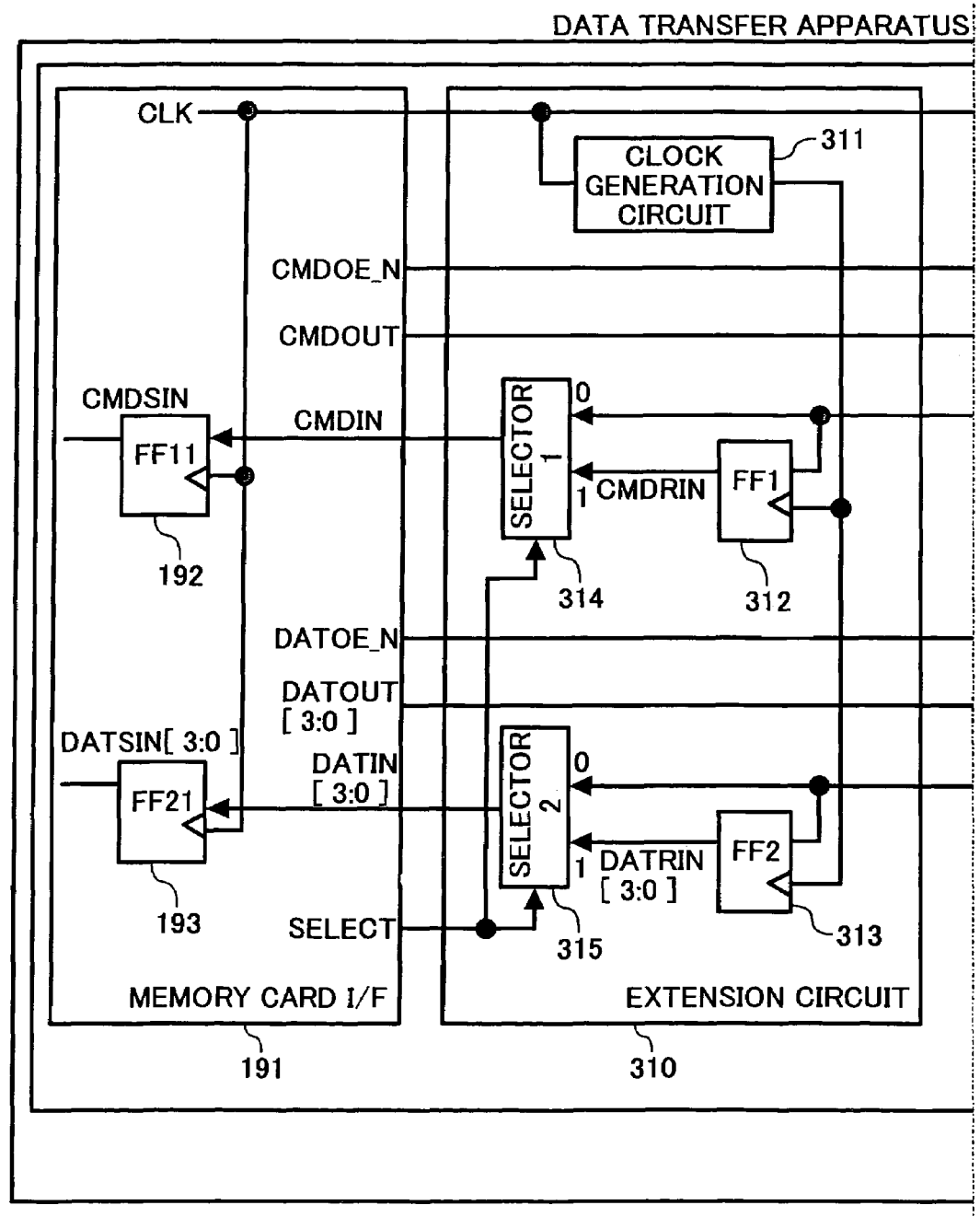
FIG. 3 is a block diagram of a circuit around a memory card I/F in the ASIC.
Figure 3B:
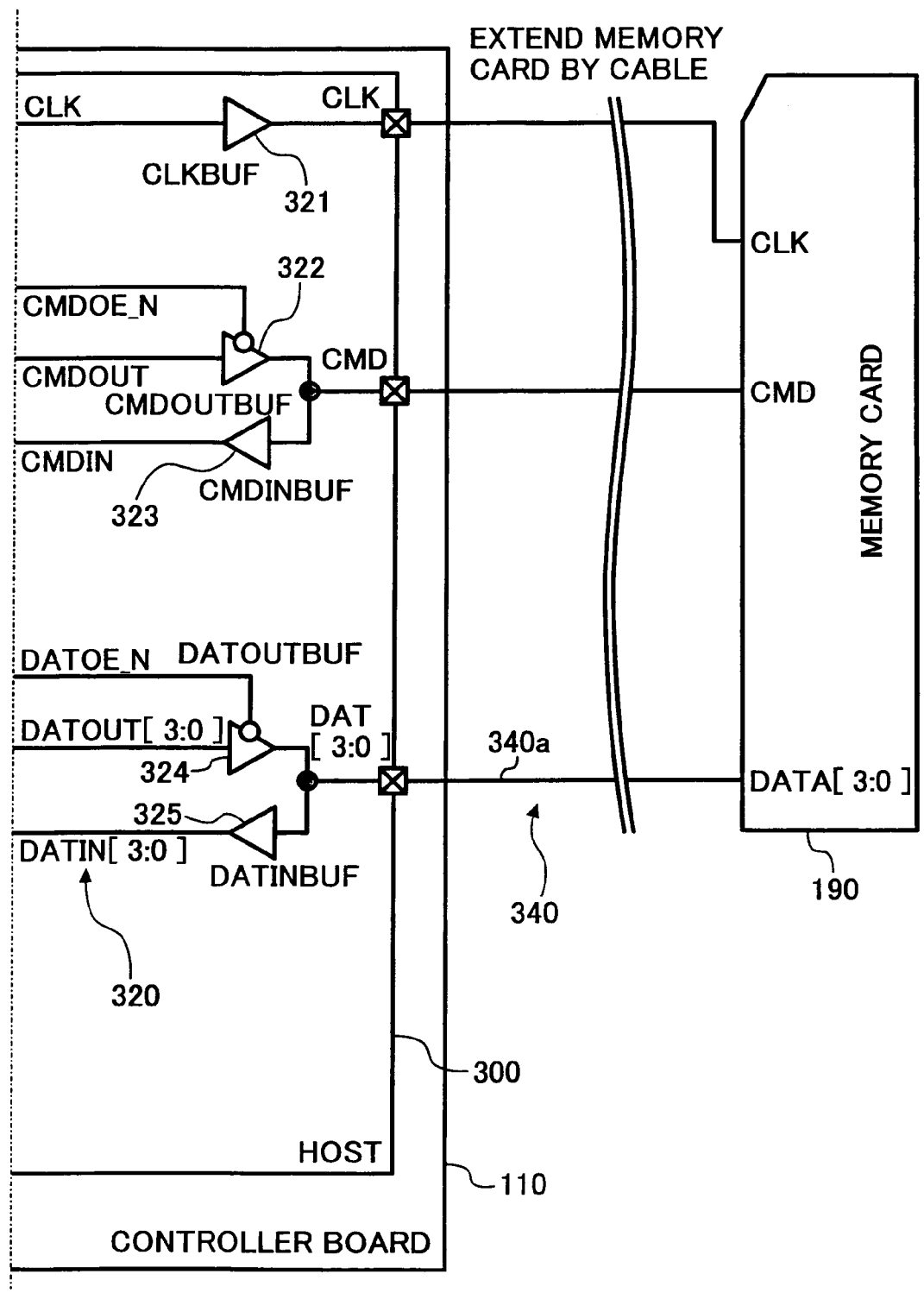

FIG. 3 is a block diagram of the details of the circuitry around the memory card I/F 191. The controller board 110 includes a host 300. The host 300 includes the memory card I/F 191, an extension circuit 310, and an I/O buffer 320 for clocks, commands, and data. The memory card 190, which is a target device, is situated at a distance (hereinafter, "extended", "extension") and it is connected to the host 300 of the controller board 110 by a cable 340.

The extension circuit 310 includes the clock generation circuit 311, the first and the second F/F 312 and 313, the first and the second selectors 314 and 315. The memory card I/F 191 includes third and fourth F/Fs 192 and 193. The I/O buffer 320 includes a CLKBUF 321, a CMDOUTBUF 322, a CMDINBUF 323, a DATAOUTBUF 324, and a DATAINBUF 325.

Figure 4:
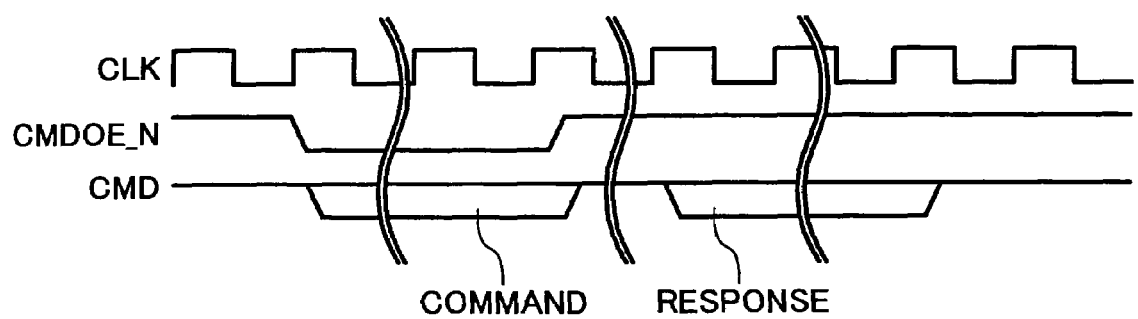
FIG. 4 is a timing chart for explaining a relation between a command output from a host and a response.

A CLK from the host 300 is sent to the memory card 190 through the CLKBUF 321. A command (data) from the host 300 is output from the CMDOUTBUF 322 when a CMDOE_N is active. Timing at this point is shown in FIG. 4. The memory card (target) 190 identifies the command (data), which is output from the host 300 in synchronization with the CLK, and returns a response to the host 300. After outputting the command, the host 300 inactivates the CMDOE_N and waits until the host 300 detects a start bit of the response from the memory card (target) 190. The response from the memory card (target) 190 is received by the CMDINBUF (response receiving unit) 323 first.

When an extension distance is large like extension distances 1 and 2 (FIGS. 5A and 5B), a select signal for an interface of the memory card 190 is set to 1 and switched to a CMDRIN, which is an output of the first F/F 312 serving as a response generating unit, in the first selector 314 in advance. The first F/F 312 serving as the response generating unit latches a CMDIN, which is an output of a CMDINBUF (response receiving unit), with a clock generated by the clock generation circuit 311 to be described later and outputs the CMDRIN.

Figure 5B:
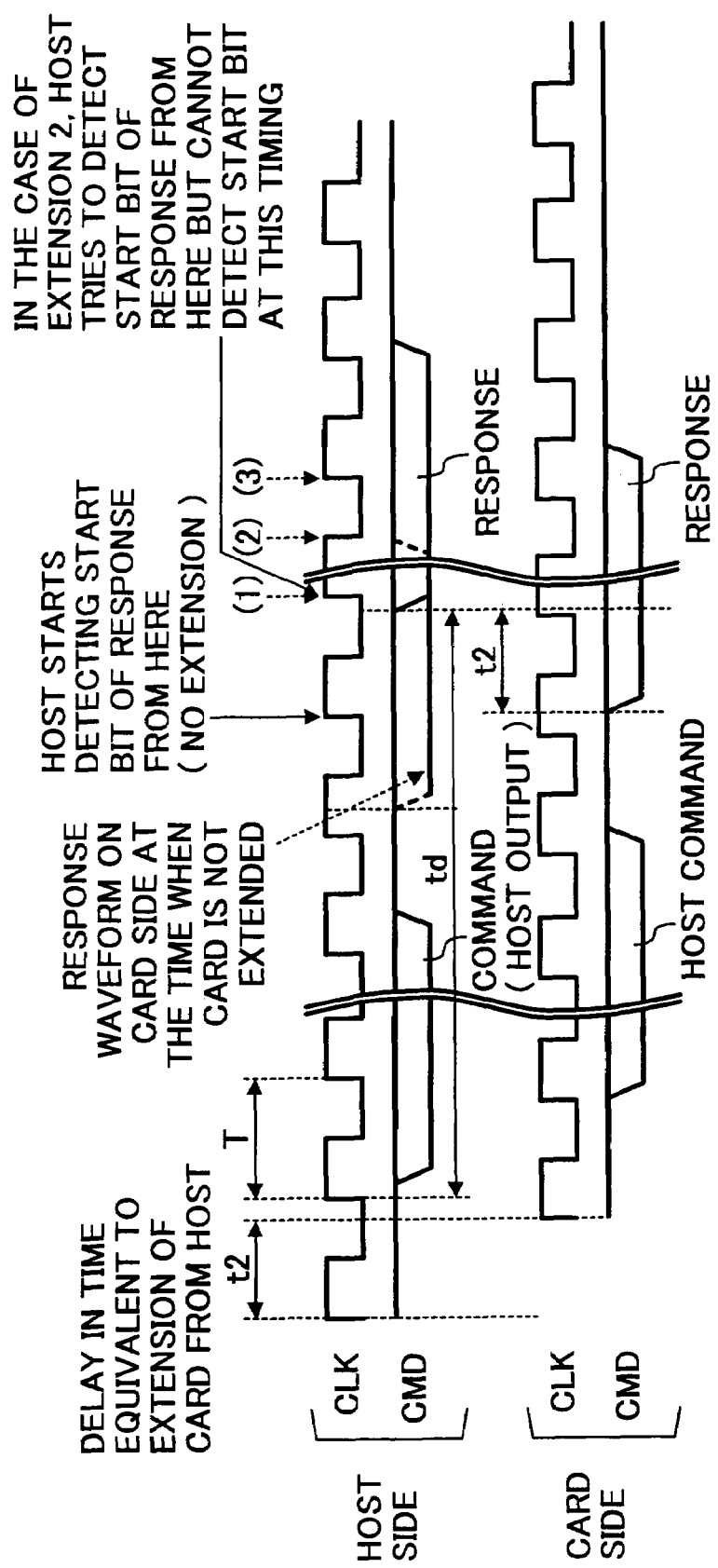
Figure 5C:
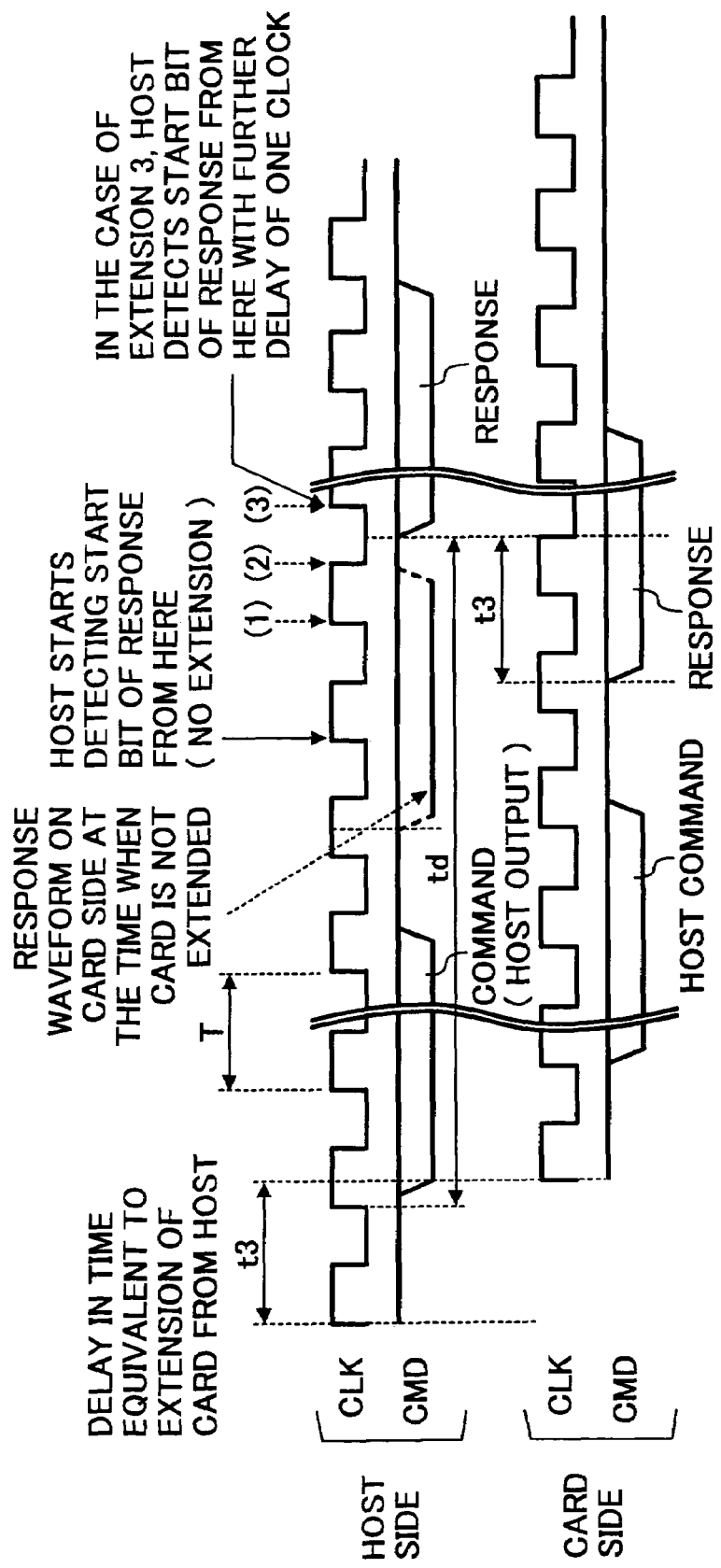
Figure 6A:
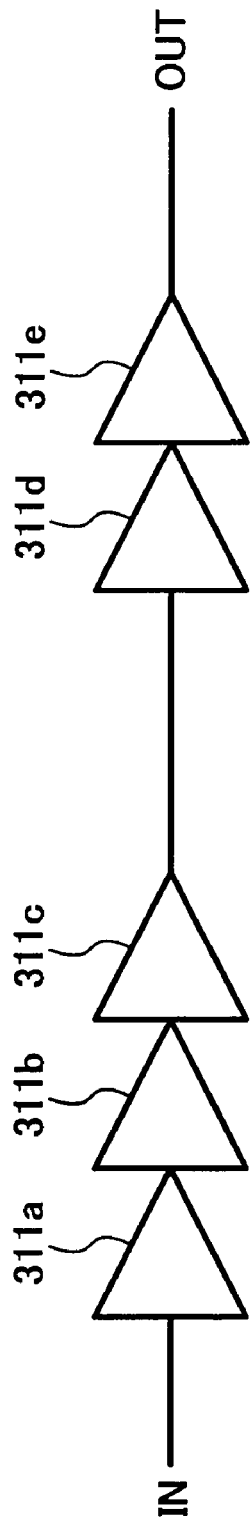
FIGS. 6A and 6B are schematics of a clock generating unit shown in FIG. 3.

An example of the clock generating unit is shown in FIG. 6. To latch the CMDIN at the timing of (2) in FIGS. 5A, 5B, and 5C, plural buffers 311a to 311d may be connected as shown in FIG. 6A to delay the clock CLK. However, in the case of FIG. 6A, it is necessary to set a total amount of delay smaller than a period T of the clock CLK.

Figure 6B:
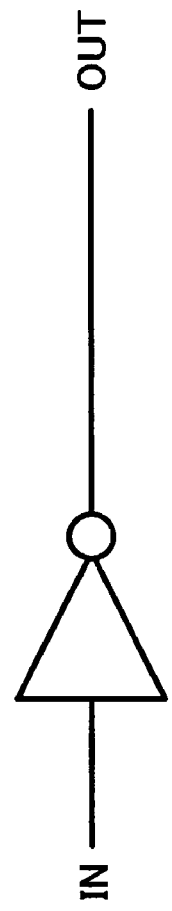

FIG. 6B shows an example in which an amount of delay of a clock is set to a half of the period T of the clock CLK, that is, an example in which the clock CLK is reversed. In the case of FIG. 6B, the number of gates can be reduced more than the case of FIG. 6A in which the plural buffers 311a to 311d are connected to increase an amount of delay. In both the cases of FIGS. 6A and 6B, it is necessary to make adjustment such that the CMDRIN selected by the first selector 314 can be latched by the third F/F 192 of the memory card interface 191 at the timing of (3) of FIGS. A, B and C.

When an extension distance is long like an extension distance 3 (FIG. 5C), a select signal for the interface 191 of the memory card 190 is set to 0 and switched to a CMDIN, which is an output of the CMDINBUF 323 serving as a response receiving unit, in the first selector 314. This makes it possible to latch an output of the first selector 314 in the third F/F 192 of the memory interface 191.

In the case of the extension distance 3, as in the case of the extension distances 1 and 2, the CMDINBUF 323 can receive a response of the memory card 190 at timing of (3) in FIGS. 5A, 5B and 5C.

As described above, in the circuit shown in FIG. 3, a method of switching a selector according to an extension distance for the memory card 190 is explained. Since a time td (FIGS. 5A to 5C) from transmission of a command from the data transmitting unit to the memory card (target) 190 until arrival of a response from the memory card (target) 190 at the CMDINBUF (response receiving unit) 323 also changes according to an extension distance,.the same effect can be obtained even when the selector is switched according to the time td.

When data is written from the host 300 using a DATA [3:0] line 340a, the data is written as described below.

The same explanation as above is applied from output of a command (data) from the host 300 to the memory card (target) 190 until reception of a response from the memory card (target) 190. A CLK from the host 300 is sent to the memory card 190 by the CLKBUF 321. When a DATOE_N is active, the data from the host 300 is output from the DATOUTBUF 324. Timing is the same as the CMDOE_N in FIG. 4. The memory card (target) 190 identifies the data output from the host 300 and returns a response to the host 300. After outputting the data, the host 300 inactivates the DATOE_N and waits until the host 300 detects a start bit of the response from the memory card (target) 190.

The response from the memory card (target) 190 is received by the DATINBUF 325 first. In the case of the short extension distances 1 and 2 (FIGS. 5A and 5B), a select signal for an interface of the memory card 190 is set to 1 and switched to a DATRIN, which is an output of the second F/F 313, in the second selector 315 in advance. The second F/F 313 latches a DATIN, which is an output of the DATINBUF 325, with a clock generated by the clock generation circuit 311 and outputs the DATRIN. This makes it possible to latch the DATRIN selected by the second selector 315 in the fourth F/F 193 of the memory interface 191.

In the case of the large extension distance 3 (FIG. 5C), a select signal for the interface 191 of the memory card 190 is set to 0 and switched to a DATIN, which is an output of the DATINBUF 325 serving as a response receiving unit, in the second selector 315. This makes it possible to latch an output of the second selector 315 in the fourth F/F 193 of the memory interface 191. Therefore, in the case of the extension distance 3, as in the case of the extension distances 1 and 2, the response to data from the memory card 190 can be received at the timing of (3) in FIGS. 5A, 5B, and 5C.

When data is read from the host 300 using the DATA [3:0] line 340a, the data is read as described below.

The same explanation as above is applied from output of a command (data) from the host 300 to the memory card (target) 190 until reception of a response from the memory card (target) 190. After receiving the response to the command (data), the host 300 keeps the DATOE_N inactive and waits until the host 300 detects a start bit of the read data from the memory card (target) 190.

In the case of the short extension distances 1 and 2 (FIGS. 5A and 5B), a select signal for the interface 191 of the memory card 190 is set to 1 and switched to a DATRIN, which is an output of the second F/F 313, in the second selector 315 in advance. The second F/F 313 latches a DATIN,.which is an output of the DATINBUF 325, with a clock generated by the clock generation circuit 311 and outputs the DATRIN. This makes it possible to latch the DATRIN selected by the second selector 315 in the fourth F/F 193 of the memory interface 191.

In the case of the large extension distance 3 (FIG. 5C), a select signal for the interface 191 of the memory card 190 is set to 0 and switched to a DATIN, which is an output of the DATINBUF (response receiving unit) 325, in the second selector 315. This makes it possible to latch an output of the second selector 315 in the fourth F/F 193 of the memory interface 191. Therefore, in the case of the extension distances 1, 2, and 3, the read data of the memory card 190 can be received as well.

This data transfer apparatus is used for, for example, data transfer of a digital composite machine that is also called a multi function peripheral (MFP).

The MFP according to this embodiment will be hereinafter explained schematically.

The MFP according to this embodiment includes an engine unit 102 that performs image formation in an electrophotographic system. In this MFP, when a start key on the operation unit 160 is depressed, a stack of originals placed on an original stand, which is provided in an automatic document feeder (hereinafter, ADF), with an image surface thereof facing upward are fed to a predetermined position on a contact glass of the scanner 101 by a feed roller and a feed belt in order from an original at the bottom. After image data of the original on the contact glass is read by a reading unit of the scanner 101, the original for which the reading is completed is discharged by the feed belt and a discharge roller.

Transfer paper stacked on sheet feeding stages consisting of a first tray, a second tray, and a third tray of the sheet feeding apparatus 103 is fed by sheet feeding units provided in the respective trays and conveyed to a position where the transfer paper comes into abutment against a photosensitive member of the engine unit 102. The image data read by the reading unit is written in the photosensitive member by laser from a writing unit. The photosensitive member passes a developing unit, whereby a toner image is formed on the photosensitive member. Then, the toner image on the photosensitive member is transferred onto the transfer paper while the transfer paper is conveyed by a conveying belt at the same speed as rotation of the photosensitive member. Thereafter, the toner image is fixed on the transfer paper by a fixing unit, and the transfer paper is discharged onto a discharge tray by a discharge unit. Since the engine unit 102, the ADF, and the sheet feeding apparatus 103 have publicly-known structures, details thereof will not be explained.

The CPU 120 executes the processing in the embodiment according to a program stored in a not-shown ROM or a program stored in a storage like a HDD. However, the program can be downloaded from, for example, a publicly-known storage like a CD-ROM or a server.

Figure 7A:
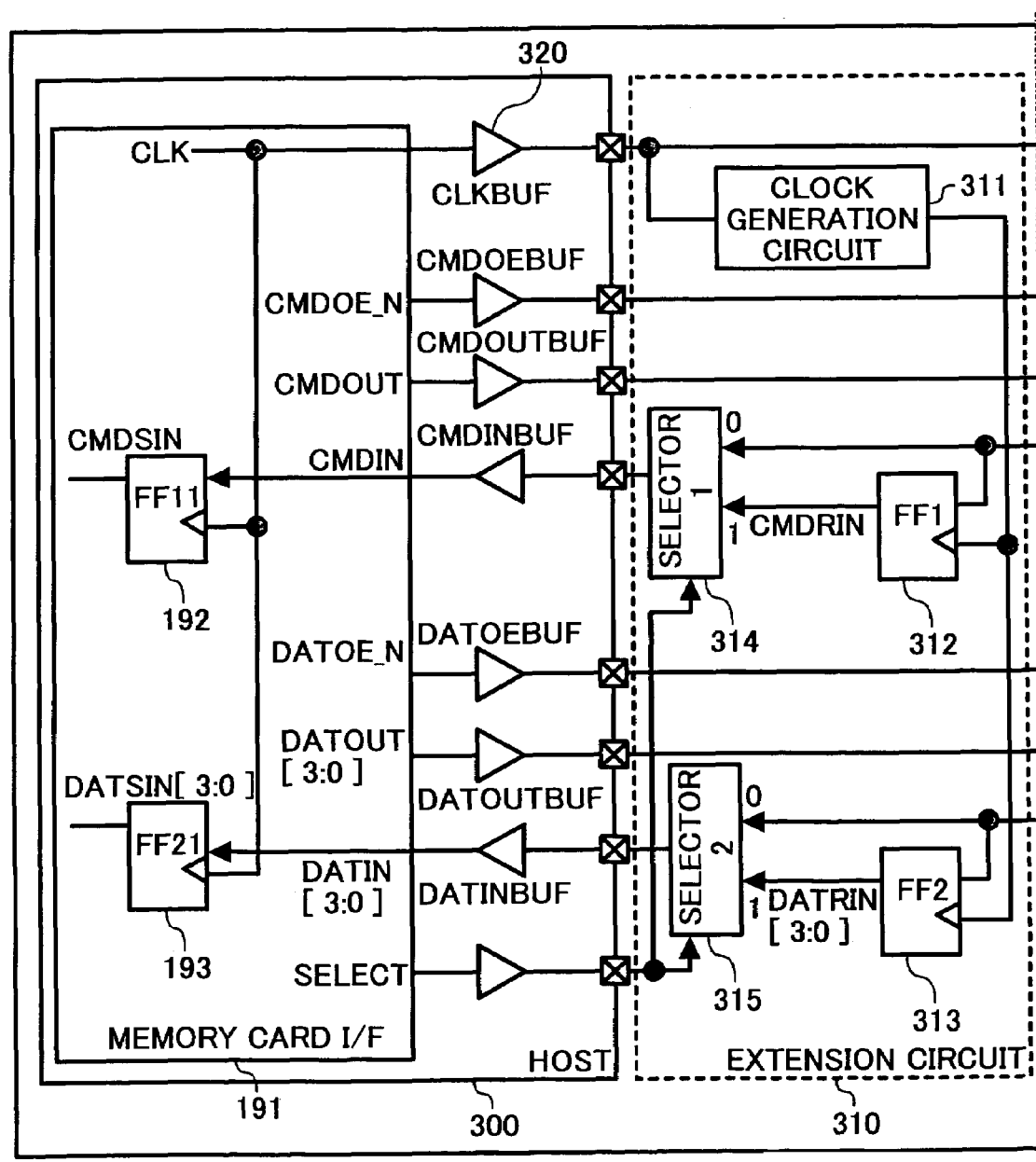
FIG. 7 is a block diagram of a circuit around a memory card I/F in an ASIC structure according to a second embodiment of the invention.
Figure 7B:
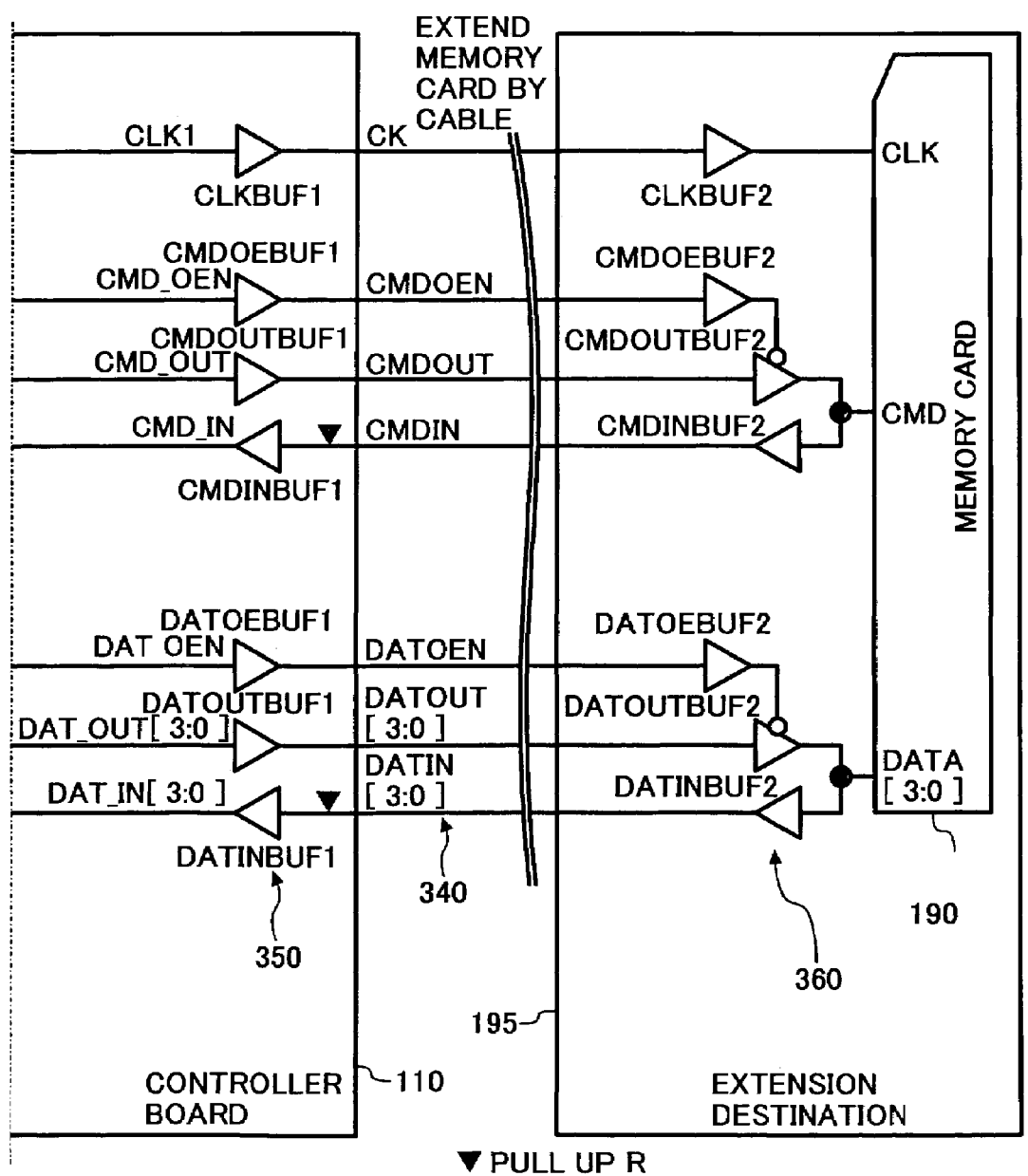

FIG. 7 is a block diagram of a circuitry around the memory card I/F 191 in a structure of the ASIC 200 according to a second embodiment. The circuit includes the memory card interface 191, the extension circuit 310, and 10 buffers for clock, command, and data 320, 350, and 360. The memory card (target) 190 is in a state in which the memory card (target) 190 is extended by a cable. This embodiment is an example in which the 10 buffers for clock, command, and data (buffers for extension) 320, 350, and 360 are inserted into clock, command, and data lines in addition to the structure of the circuit according to the first embodiment shown in FIG. 3.

Note that, in the following explanation, buffers and signals are not denoted by reference numerals and signs but are directly denoted by abbreviations shown in the figures.

A CLK from the host 300 is sent to the memory card 190 by a CLKBUF, a CLKBUF1, and a CLKBUF2. A command (data) from the host 300 is output from a CMDOUTBUF when a CMDOE_N is active. A CMDOEN becomes active via a CMDOEBUF, a CMDOEBUF1, and a CMDOEBUF2, and the command (data) is output from a CMDOUTBUF2 to the memory card (target) 190. Timing is the same as that shown in FIG. 4 in the first embodiment.

The memory card (target) 190 identifies the command (data) output from the host 300 and returns a response to the host 300. After outputting the command, the host 300 inactivates the CMDOE_N and waits until the host 300 detects a start bit of the response from the memory card (target) 190. When the CMDOE_N is inactivated, the CMDOEN becomes inactive via the CMDOEBUF, the CMDOEBUF1, and the CMDOEBUF2, and an output of the CMDOUTBUF2 becomes HiZ (high impedance).

The response from the memory card (target) 190 is received by the CMDINBUF (response receiving unit) 323 via the CMBINBUF2 and the CMDINBUF1.

A delay due to a size of an extension distance is equivalent to the timing shown in the timing chart of the extension 1-3 in FIG. 5, and select signal control is also the same as that in the first embodiment. In addition, the clock generation circuit 311 is the same as that in the first embodiment. Note that reference numeral 195 denotes a board in an extension destination (extension board) mounted with the memory card 190 and the buffer 360.

<Write Data from the Host Using the DATA [3:0] Line>

Next, a case in which data is written from the host 300 using the DATA [3:0] line will be explained.

The same explanation as above is applied from output of a command (data) from the host 300 to the memory card (target) 190 until reception of a response from the memory card (target) 190.

A CLK from the host 300 is sent to the memory card 190 by the CLKBUF. When the DATOE_N is active, the data from the host 300 is output from the DATOUTBUF. A DATOEN becomes active via the CMDOEBUF, the DATOEBUF1, and the DATOEBUF2, and the data is output from the DATOUTBUF2 to the memory card (target) 190. Timing is the same as the CMDOE_N in FIG. 2.

The memory card (target) 190 identifies the data output from the host 300 and returns a response to the host 300. After outputting the data, the host 300 inactivates the DATOE_N and waits until the host 300 detects a start bit of the response from the memory card (target) 190. The DATOEN becomes inactive via the DATOEBUF, the DATOEBUF1, and the DATOEBUF2, and an output of the DATOUTBUF2 becomes HiZ (high impedance). The response from the memory card (target) 190 is received by the DATINBUF via the DATINBUF2 and the DATINBUF1.

Extensions in the cases of the extension distances 1, 2, and 3 are the same as the extension 1-3 of the data transfer apparatus in FIGS. 5A to 5C, and select signal control is also the same as that in the first embodiment. In addition, the clock generation circuit 3 is also the same as that in the first embodiment.

<Read Data from the Host Using the DATA [3:0] Line>

Next, a case in which data is read from the host 300 using the DATA [3:0] line will be explained.

The same explanation as above is applied from output of a command (data) from the host 300 to the memory card (target) 190 until reception of a response is received from the memory card (target) 190. After receiving the response for the command (data), the host 300 keeps the DATOE_N inactive and waits until the host 300 detects a start bit of read data from the memory card 190. The DATOEN becomes inactive via the DATOEBUF, the DATOEBUF1, and the DATOEBUF2, and an output of the DATOUTBUF2 becomes HiZ (high impedance). The response from the memory card (target) 190 is received by the DATINBUF via the DATINBUF2 and the DATINBUF1.

A delay due to a size of an extension distance is equivalent to the timing shown in the timing chart of the extension 1-3 in FIG. 5, and select signal control is also the same as that in the first embodiment. In addition, the clock generation circuit 311 is also the same as that in the first embodiment.

In the data transfer apparatus according to this embodiment, the buffers for extension 320, 350, and 360 are inserted into clock, command, and data lines in addition to the structure of the example shown in FIG. 3. Thus, an extension distance can be set longer than that in the data transfer apparatus in FIG. 3.

Figure 8:
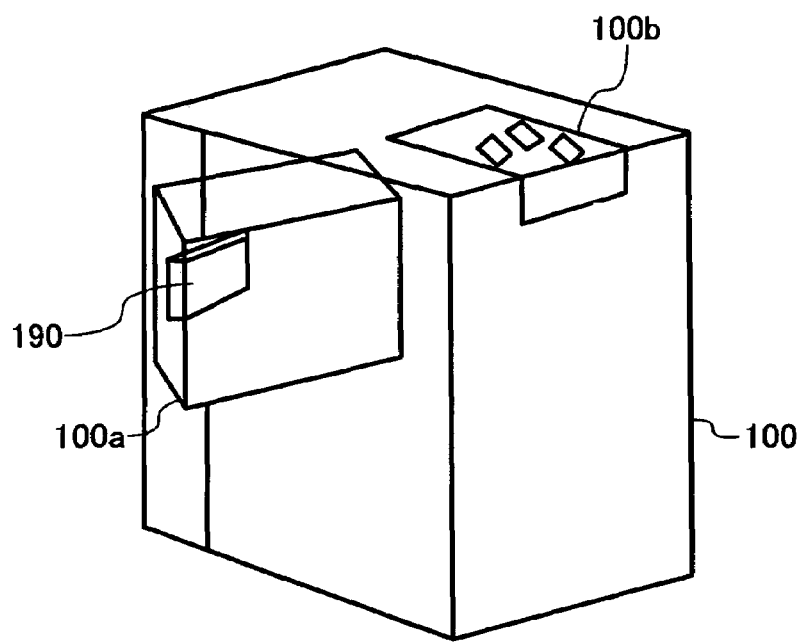
FIG. 8 is a diagram showing a conventional state of use of a memory card in which the memory card in FIG. 1 is mounted on a control box provided on a rear side of the MFP.

FIG. 8 is a schematic for explaining how the memory card was conventionally used. Precisely, the memory card 190 in FIG. 1 is mounted on a control box provided on a rear side of the MFP 100. The memory card 190 (here, SD card) is mounted on a control box 110a in a state in which the memory card 190 is connected to the controller board 100 mounted on the control box 110a. For example, in the memory card 190 such as the SD card, as a standard, a response signal from a memory card is sent within a specified clock in response to a command from a host. If the memory card 190 is used in the MFP 100 according to this standard, unless a card slot is provided in the control box 100a, the standard cannot be satisfied. This holds true in cards other than the SD card 190. This is because an extension distance for allowing a card to operate accurately is very small. Incidentally, a distance to a connection point of an output end of the memory card I/F 190 and the cable 340 of the host 300 may be as long as about 50 cm in the case of the first embodiment shown in FIG. 3. It is highly likely that, with memory cards including an SD card, the CPU 120 of the host device cannot receive a response from the memory card 190. Thus, it is a general practice to provide a card slot on the controller board 110.

However, the MFP 100 is required to include an operation unit and a space for an operation for jam treatment in the front or include a space for replacing a developer. Thus, the controller board 110 is often provided on the rear side of the MFP 100. Actually, since a card slot or a card connector can be provided only in this position, this is inconvenient in operation, and the memory card 190 is not used in the MFP 100 so often despite the fact that the memory card 190 itself is widely used at present.

Figure 9:
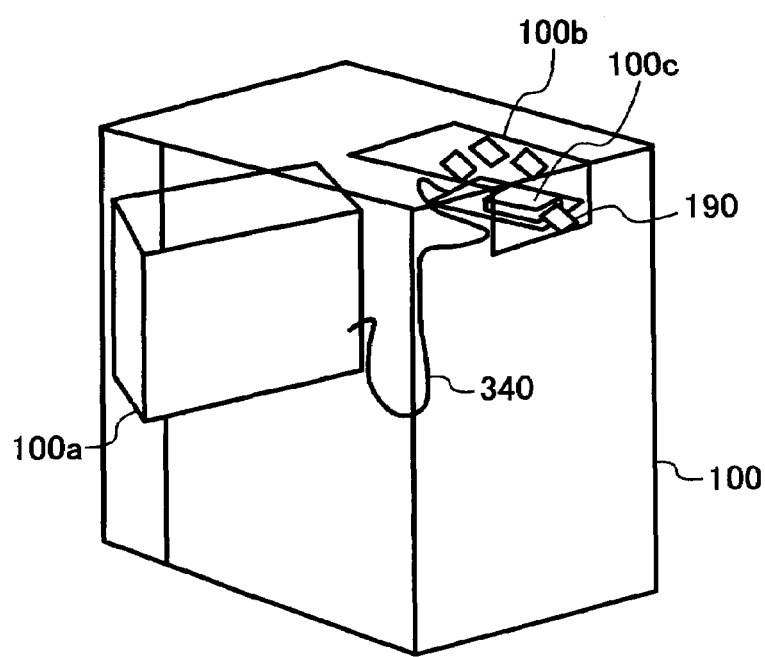
FIG. 9 is a diagram showing a state at the time when a setting position for the memory card is set in an operation unit.

On the other hand, in this embodiment, a response from the memory card 190 can be received surely even if an extension distance is extended by the cable 340. Thus, a card slot or a memory connector 100c can be provided in an operation unit 100b in the front of the MFP 100 by stretching the cable 340 from the control box 100a as shown in FIG. 9. In that case, since a select signal is switched according to a distance, a setting location for a card slot or a memory connector 100d is never limited, and usability of the memory card 190 in the MFP 100 is improved. For example, when the cable 340 is stretched as shown in FIG. 9, the cable 340 has a length of 1 to 2 meters.

Besides, components not specifically explained are constituted and function in the same manner as those in the first embodiment.

Figure 10A:
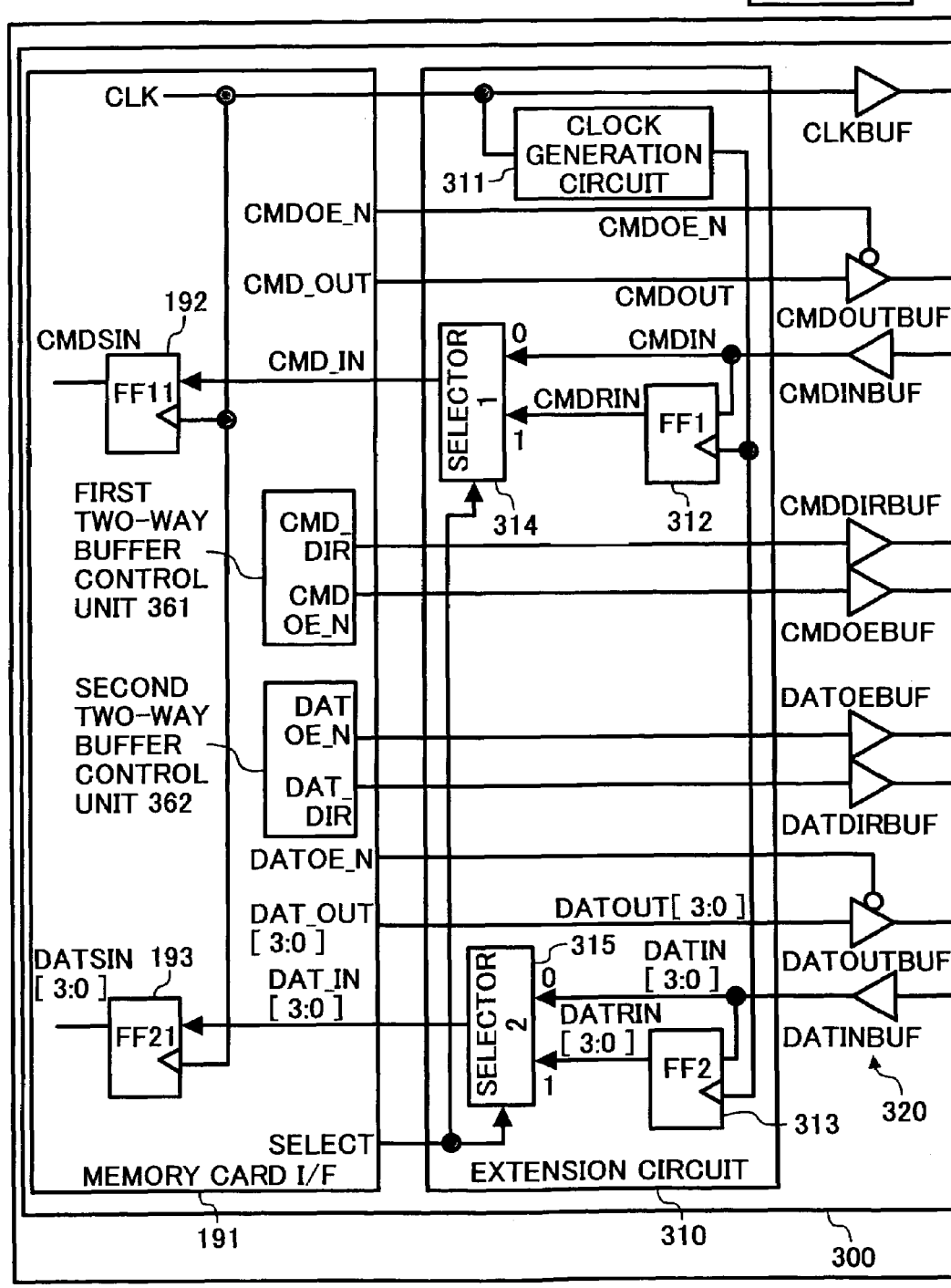
FIG. 10 is a block diagram of a circuit around a memory card I/F in an ASIC structure according to a third embodiment of the present invention.
Figure 10B:
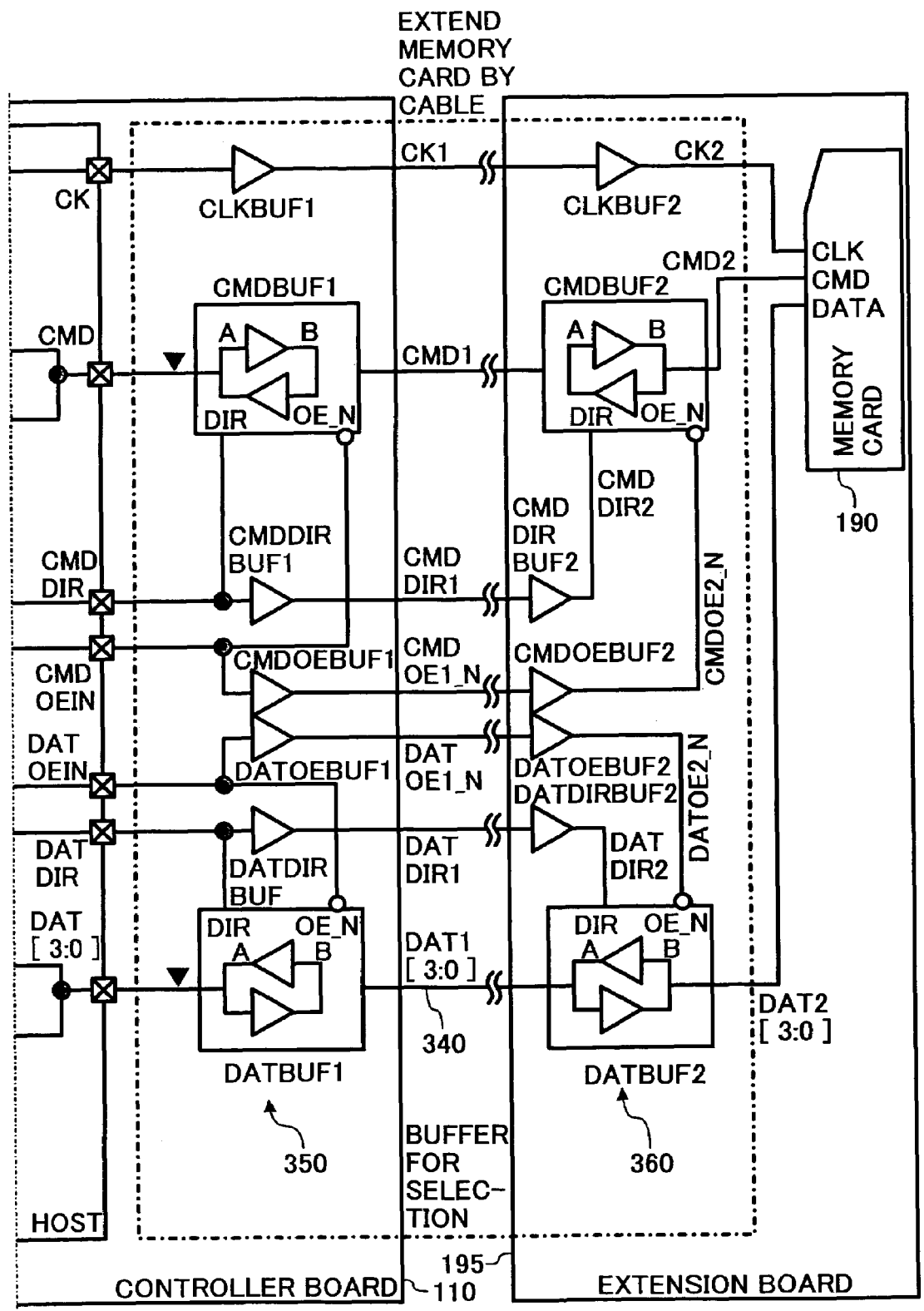

FIG. 10 is a block diagram of a circuitry around the memory card I/F 191 in a structure of the ASIC 200 according to a third embodiment. The circuit includes the memory card interface 191, the extension circuit 310, and the 10 buffers for clock, command, and data 320, 350, and 360, and a buffer for extension 370 is constituted by the 10 buffers 350 and 360 and the cable for extension 340. The memory card (target) 190 is in a state in which the memory card (target) 190 is extended by the cable 340. In this embodiment, a two-way buffer and two-way buffer control are combined with the structure of the ASIC 200 in FIG. 7.

Two-way buffers CMDBUF1, CMDBUF2, DATBUF1, and DATBUF2 output data in a direction from A to B when DIR is High and in a direction from B to A when DIR is Low. Inputs and outputs of the two-way buffers become Hiz (high impedance) when OE_N is High. When OE_N is Low, data is output in a direction set in DIR.

A CLK from the host 300 is sent to the memory card 190 by the CLKBUF, the CLKBUF1, and the CLKBUF2. A command (data) from the host 300 is output from the CMDOUTBUF when the CMDOE_N is active. Further, the command (data) is output to the memory card (target) 190 via the CMDBUF1 and the CMDBUF2 that are two-way buffers. Control for buffer directions and output signals of the two-way buffers CMDBUF1 and CMDBUF2 is performed by a first two-way buffer control unit 361.

A CMDDIRBUF outputs a CMDDIR with a CMD_DIR as an input. The CMDDIRBUF1 outputs a CMDDIR1 with the CMDDIR as an input, and the CMDDIRBUF2 outputs a CMDDIR2 with the CMDDIR1 as an input. In addition, the CMDOEBUF outputs a CMDOE1 N with a CMDOE_N as an input. The CMDOEBUF1 outputs a CMDOE1_N with the CMDOE1 N as an input. The CMDOEBUF2 outputs a CMDOE2_N with the CMDOE1_N as an input.

FIG. 11 is a timing chart of control timing for the first two-way buffer control unit 361.

A CLK is a signal from the host (memory card I/F) 300. A CMD_DIR and a CMDOE_N are output signals from the first two-way buffer control unit 361. In section A, the two-way buffers CMDBUF1 and CMDBUF2 are in an input mode (data is input from a memory card) (the CMD-DIR is Low, and the CMDOE_N is Low). In section B, the two-way buffers CMDBUF1 and CMDBUF2 are in a HiZ (high impedance) state (the CMDOE1_N is High). At a falling edge of the CLK in (1), the first two-way buffer control unit 361 changes buffer directions of the two-way buffers CMDBUF1 and CMDBUF2 to "input to output" (the CMD_DIR is High). In section C, the first two-way buffer control unit 361 enables an output to a buffer (the CMDOEI_N is changed to Low) and changes the two-way buffers CMDBUF1 and CMDBUF2 to an output mode. When the two-way buffers CMDBUF1 and CMDBUF2 are in the output mode, the first two-way buffer control unit 361 activates the CMDOE_N (changes the CMDOE_N to Low) at timing of (2) to transfer a CMD_OUT from the host 300 to the memory card. After outputting a command, the host 300 inactivates the CMDOE_N at timing of (3) to prepare for detecting a start bit of a response from the memory card (target) 190. The memory card (target) 190 identifies the command (data) output from the host 300 and returns a response to the host 300. In section D, the first two-way buffer control unit 361 changes the CMDOE1_N to High again and changes the two-way buffers CMDBUF1 and CMDBUF2 to HiZ (high impedance). Then, the first two-way buffer control unit 361 inactivates the CMD_DIR (changes the CMD_DIR to Low) at timing of (4) to prepare for the two-way buffers CMDBUF1 and CMDBUF2 to change to the input mode. In section E, the first two-way buffer control unit 361 changes the CMDOE1_N to Low, the two-way buffers CMDBUF1 and CMDBUF2 change to the input mode, and the response from the memory card (target) can be passed to the host 300. The response from the memory card (target) is received by the CMDINBUF (response receiving unit) via the CMDBUF2 and the CMDBUF1. The host 300 can detect a start bit from the memory card (target) and receive the response.

A delay due to a size of an extension distance is equivalent to the timing shown in the timing chart of the extension 3 in FIG. 5, and select signal control is also the same as that in the first embodiment. In addition, the clock generation circuit 311 is also the same as that in the first embodiment.

<Write Data from the Host Using the DATA [3:0] Line>

A case in which data is written from the host 300 using the DATA [3:0] line will be explained.

The same explanation as above is applied from output of a command (data) from the host 300 to the memory card (target) 190 until reception of a response from the memory card (target) 190.

A CLK from the host 300 is sent to the memory card 190 from the CLKBUF, the CLKBUF1, and the CLKBUF2. The data from the host 300 is output from the DATAOUTBUF when the DATOE_N is active. Further, the data is output to the memory card (target) 1909 via the DATBUF1 and DATBUF2 that are two-way buffers. A second two-way buffer control unit 362 performs control for buffer direction and output signals of the two-way buffers DATBUF1 and DATBUF2.

A DATDIRBUF outputs a DATDIR with a DAT_DIR as an input. A DATDIRBUF1 outputs a DATDIR1 with the DATDIR as an input. A DATDIRBUF2 outputs a DATDIR2 with the DATDIR1 as an input. In addition, a DATOEBUF outputs a DATOEIN with a DATOE_N as an input. A DATOEFUF1 outputs a DATOE1_N with the DATOE1N as an input. A DATOEBUF2 outputs a DATOE2_N with the DATOEL_N as an input.

Figure 12:
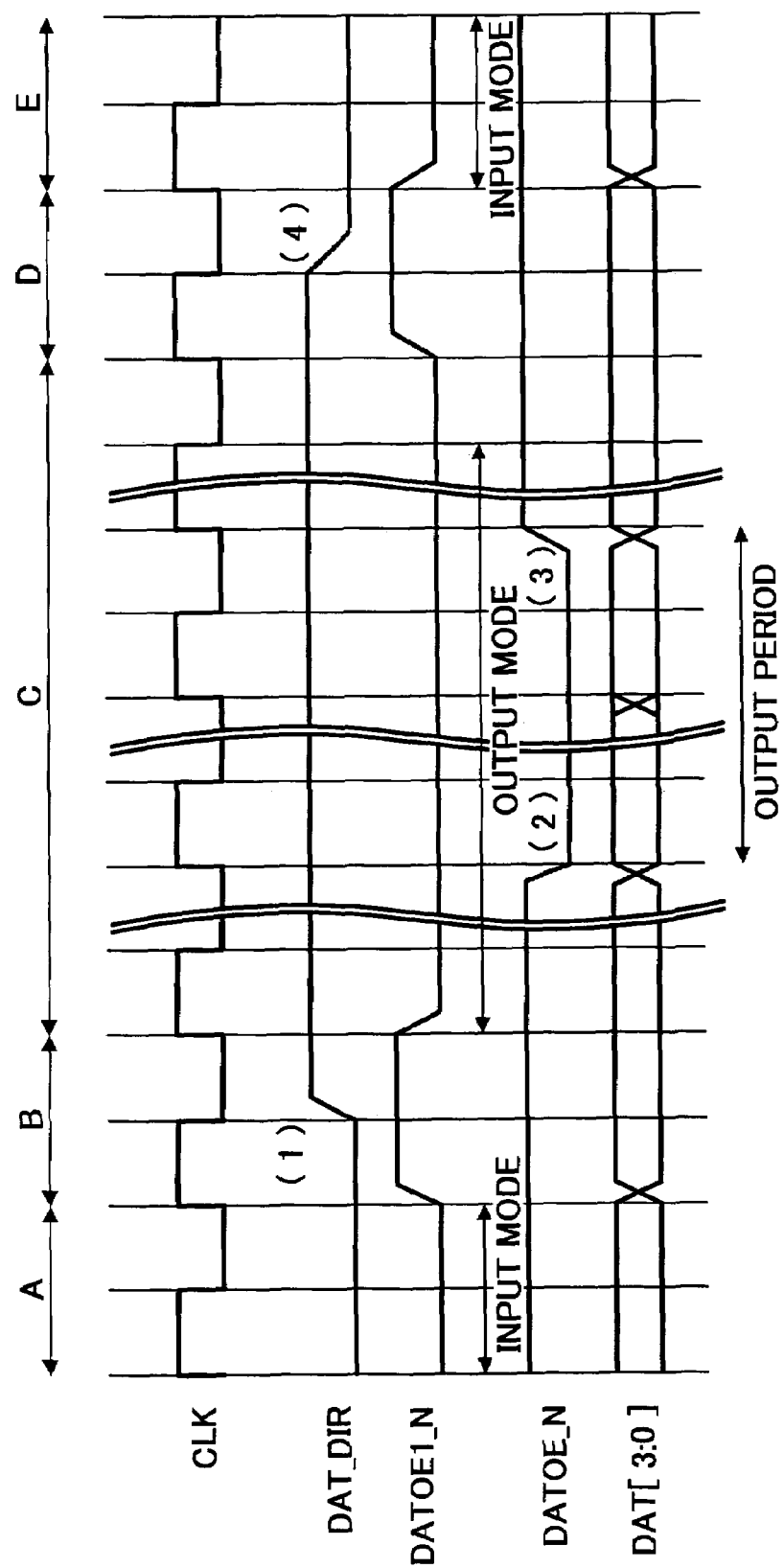
FIG. 12 is a timing chart for explaining control timing for a second two-way buffer control unit in FIG. 10.

FIG. 12 is a timing chart of timing of the second two-way buffer control unit 362 in FIG. 10. In the figure, a CLK is a signal from the host (memory card I/F) 300. A DAT_DIR and a DATOE_N are output signals from the second two-way buffer control unit 362. In section A, the two-way buffers DATBUF1 and DATBUF2 are in an input mode (input data from the memory card 190 (the DAT_DIR is Low, and the DATOE_N is Low). In section B, the two-way buffers DATBUF1 and DATBUF2 are in a HiZ (high impedance) state (the DATOE_N is High). AT a falling edge of the CLK in (1), the second two-way buffer control unit 362 changes buffer directions of the two-way buffer DATBUF1 and DATBUF2 to "input to output" (the DAT_DIR is High). In section C, the second two-way buffer control unit 362 enables an output of a buffer (changes the DATOE1_N to Low) and changes the two-way buffers DATBUF1 and DATBUF2 to an output mode. When the two-way buffers DATBIF1 and DATBUF2 are in the output mode, the second two-way buffer control unit 362 activates the DATOE_N (changes the DATOE_N to Low) at timing of (2) to transfer the DAT_OUT from the host 300 to the memory card 190 that is a target. After outputting the data, the host 300 inactivates the DATOE_N at timing of (3) to prepare for detecting a start bit of a response from the memory card (target) 190.

The memory card (target) 190 identifies the data output from the host 300 and returns a response to the host 300. In section D, the second two-way buffer control unit 362 changes the DATOE1_N to High again and changes the two-way buffers DATBUF1 and DATBUF2 to HiZ (high impedance). Then, the second two-way buffer control unit 362 inactivates the DAT_DIR (changes the DAT_DIR to Low) at timing of (4) to prepare for the two-way buffers DATBUF1 and DATBUF2 to change to the input mode. In section E, the second two-way buffer control unit 362 changes the DATOEL_N to Low, the two-way buffers DATBUF1 and DATBUF2 change to the input mode, and the response from the memory card (target) 190 can be passed to the host 300. The response from the memory card (target) 190 is received by the DATINBUF (response receiving unit) via the DATBUF2 and the DATBUF1. The host 300 can detect a start bit from the memory card (target) 190 and receive the response.

A delay due to a size of an extension distance is equivalent to the timing shown in the timing chart of the extension 3 in FIG. 5, and select signal control is also the same as that in the first embodiment. In addition, the clock generation circuit 311 is also the same as that in the first embodiment.

<Read Data from the Host Using the DATA [3:0] Line>

Next, a case in which data is read from the host 300 using the DATA [3:0] line will be explained.

The same explanation as above is applied from output of a command (data) from the host 300 to the memory card (target) 190 until reception of a response from the memory card (target) 190. After receiving a response to the command (data), the host 300 inactivates the DATOE_N (changes the DATOE_N to High) and changes an output of the DATOUTBUF to Hiz (high impedance). The second two-way buffer control unit 362 changes the DAT_DIR to Low and activates the DATOE1_N (changes the DATOEL_N to Low) to change the two-way buffers DATBUF1 and DATBUF2 to the input mode (Section A or E in FIG. 12). Then, the second two-way buffer control unit 362 detects a start bit of read data from the memory card 190 and receives the read data in the DATINBUF via the DANTINBUF2 and the DANTINBUF1.

Extensions in the cases of the extension distances 1, 2, and 3 are the same as the extension 3 of the data transfer apparatus in FIGS. 5A to 5C, and select signal control is also the same as that in the first embodiment. In addition, the clock generation circuit 3 is also the same as that in the first embodiment.

Compared with the second embodiment shown in FIG. 7, in this embodiment, the number of terminals of an ASIC and the number of buffers can be reduced, and cost reduction is possible.

In the first to the third embodiments, selection and setting for the first and the second selectors 314 and 315 are performed according to a select signal for the memory card interface 191. This setting can also be performed by a switch SW on the controller board 110. A fourth embodiment indicates examples of the setting.

Figures 13A, 13B:
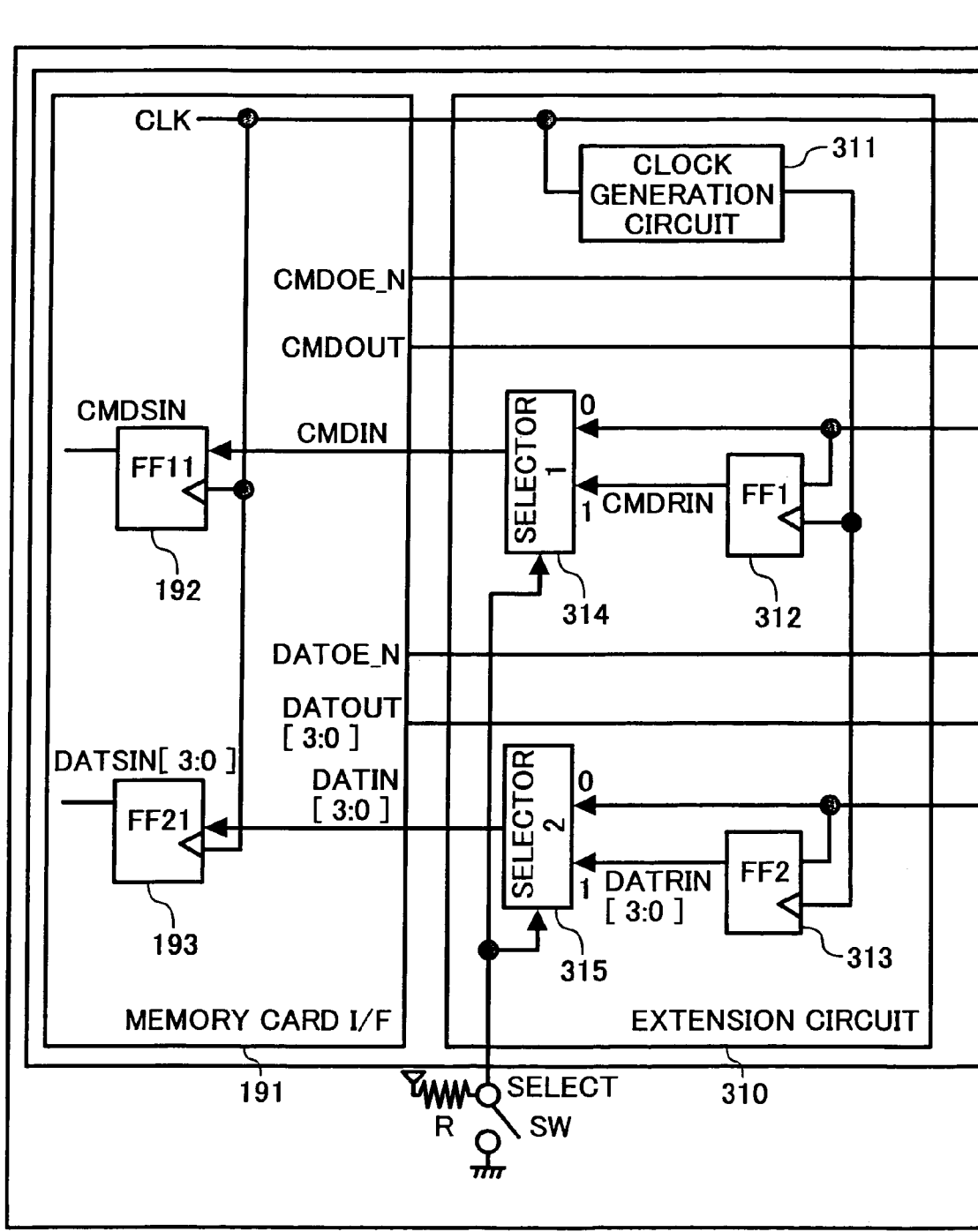
FIG. 13 is a modification of the first embodiment shown in FIG. 3.
Figure 13B:
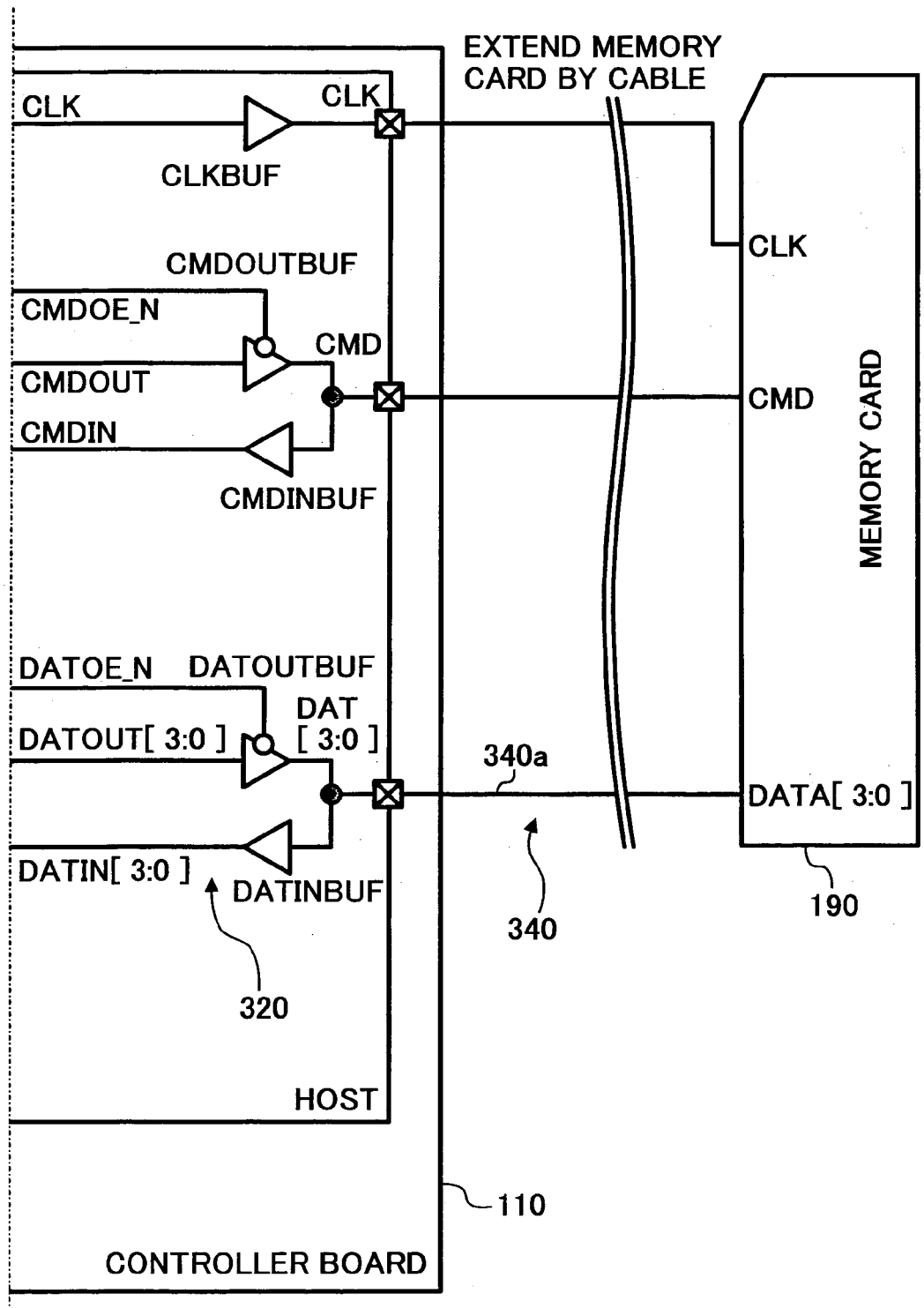
Figure 14A:
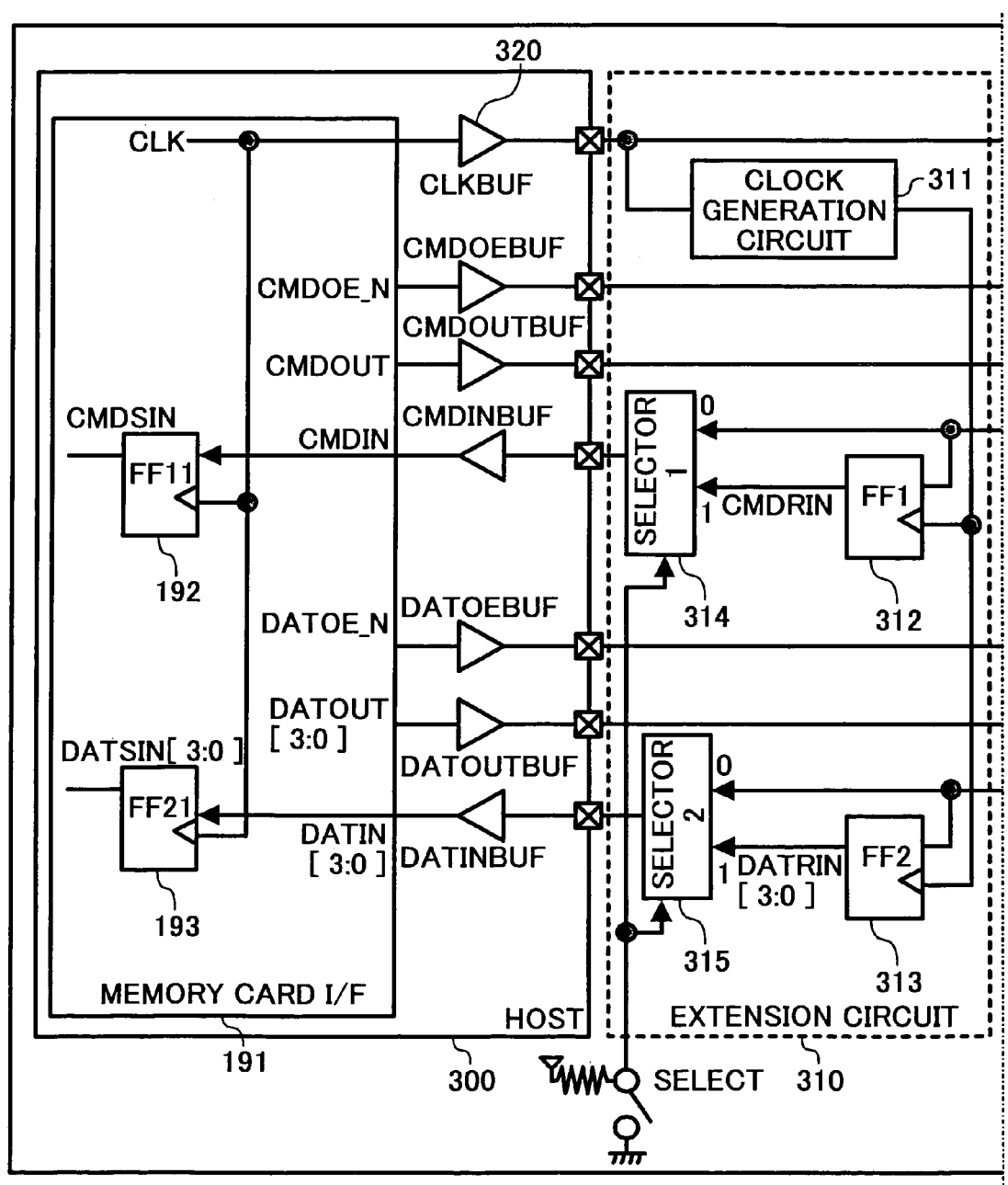
FIG. 14 is a modification of the second embodiment shown in FIG. 7.
Figure 14B:
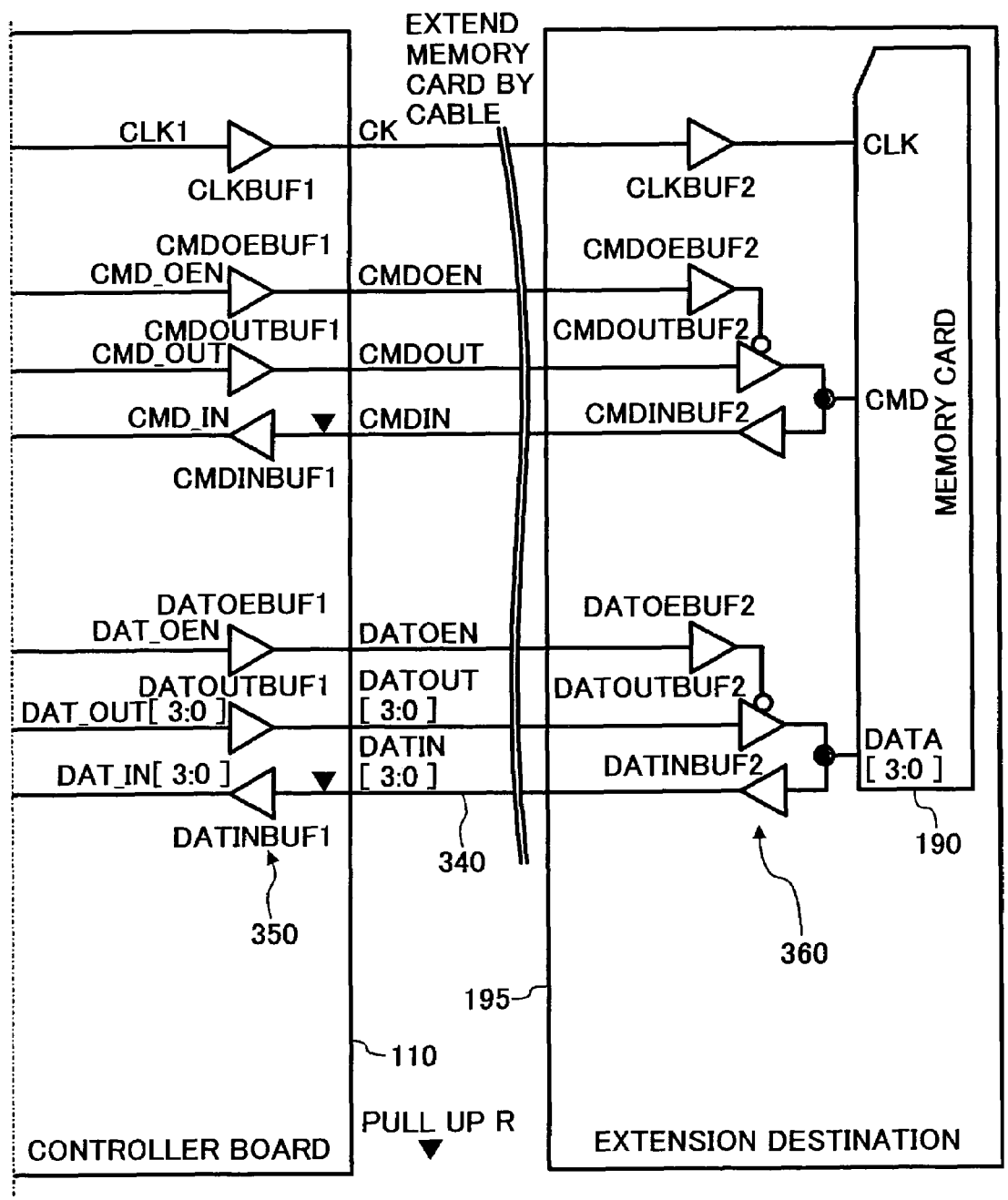
Figure 15A:
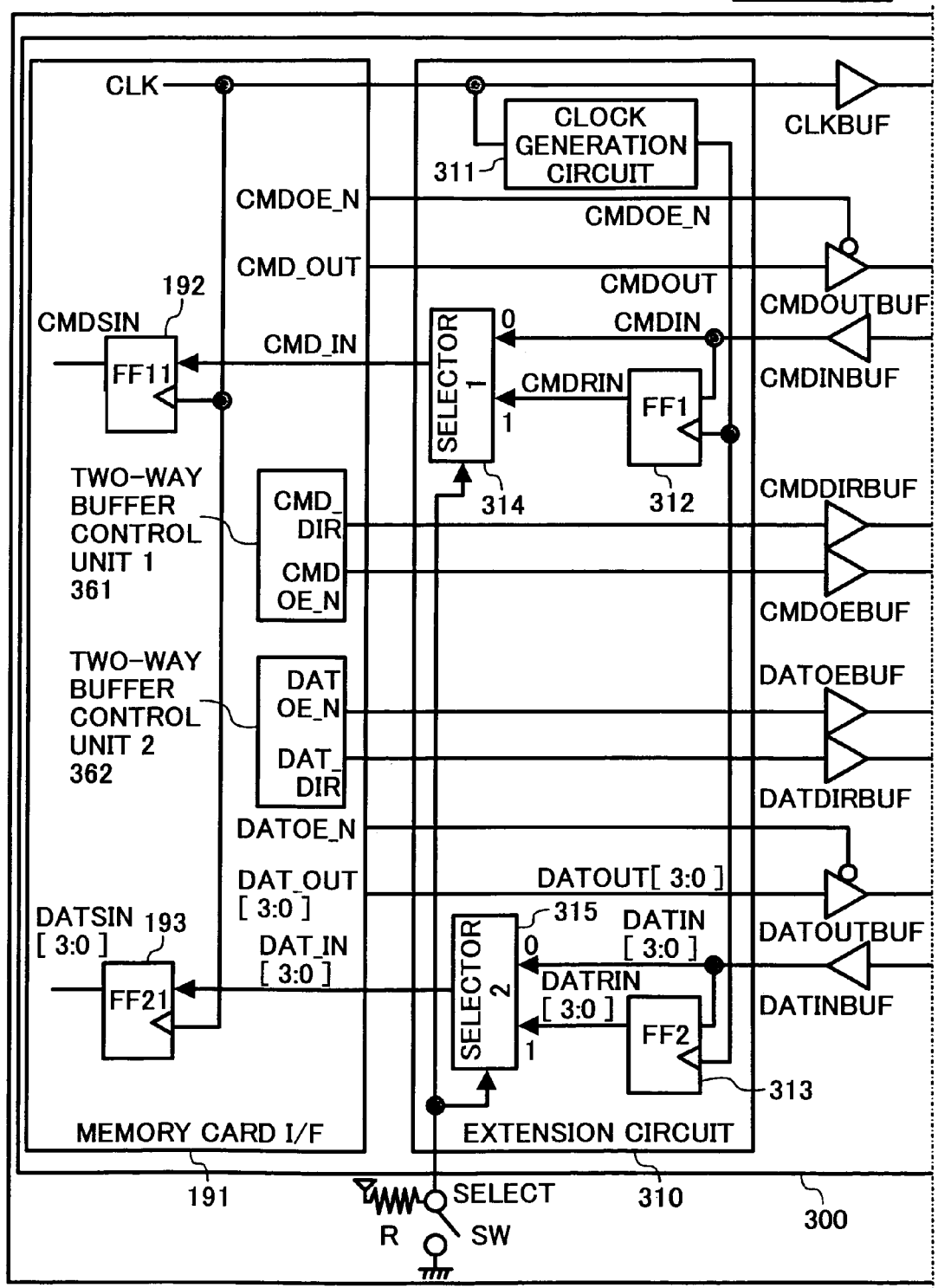
FIG. 15 is a modification of the third embodiment shown in FIG. 10.
Figure 15B:
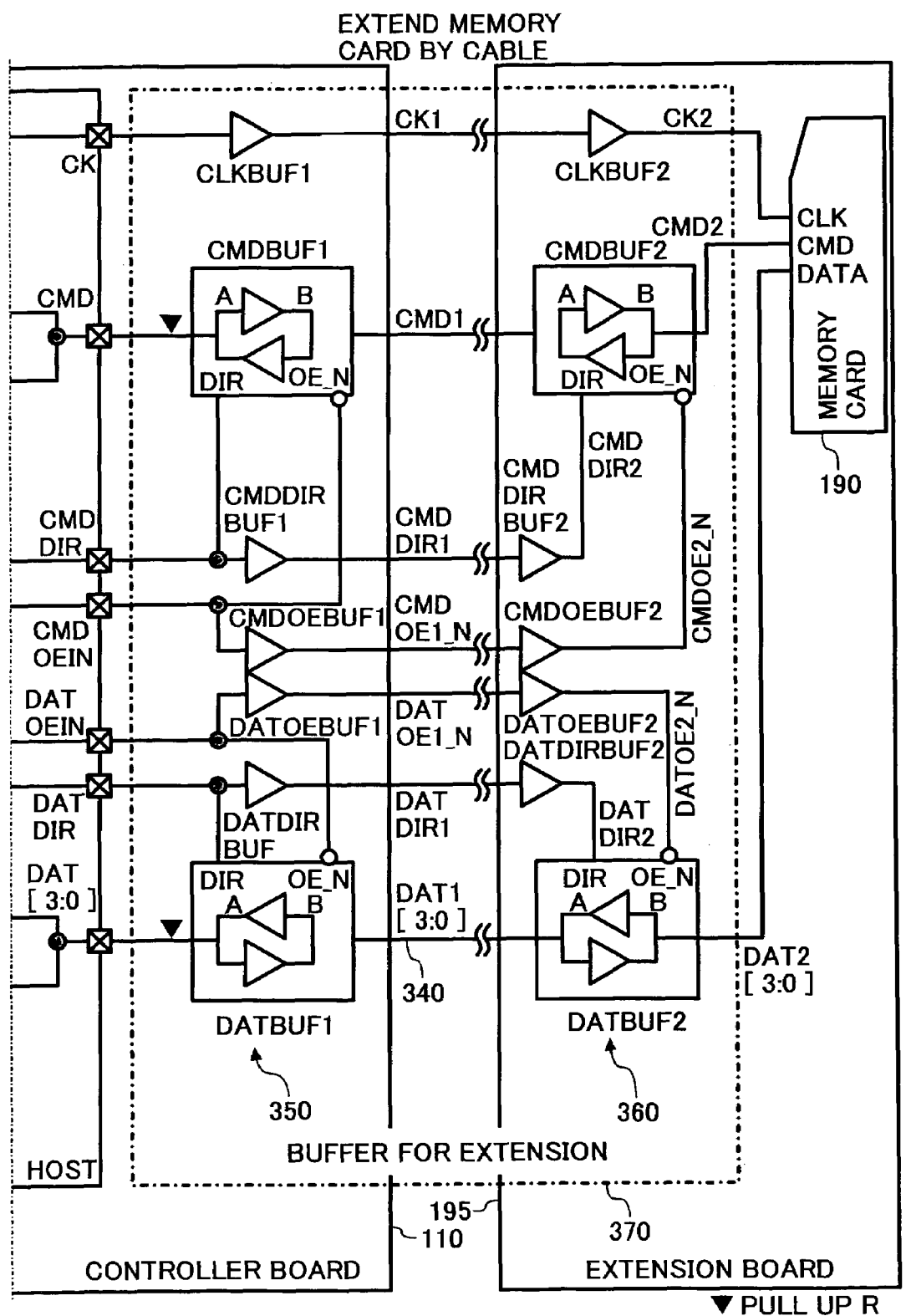

These examples are shown in FIGS. 13, 14, and 15. FIGS. 13, 14, and 15 shows examples in which setting for select signals output from the memory card I/Fs 191 shown in FIG. 3 in the first embodiment, FIG. 7 in the second embodiment, and FIG. 10 in the third embodiment is performed by the switch SW, respectively. In these examples, constitutions and operations of components other than the setting for the selectors 314 and 315 set by the switch SW are the same as those in the first, the second, and the third embodiments.

According to the invention, two-way data transfer is made possible, transfer failure never occurs even when the subordinate devices are provided at an extended distance from the host device. Thus, even when a target is provided at an extended distance from a host, data transfer can be efficiently performed.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth:

What is claimed is:
1. A data transfer apparatus comprising:
a clock transmitting unit configured to transmit a first clock to a target for data transfer that is situated at a distance from the data transfer apparatus;
a data transmitting unit configured to transmit in synchronization with the first clock data including a start signal to the target;
a response receiving unit configured to receive from the target a response having therein the start signal and output a first response based on the response received;
a clock generating unit configured to receive the first clock and generate a second clock based on the first clock, wherein the second clock is delayed less than one clock cycle from the first clock;

a response generating unit configured to generate in synchronization with the second clock a second response based on the first response; and a selector configured to select any one of the first response and the second response depending on the distance.

2. The data transfer apparatus according to claim 1, further comprising:
a bus configured to transmit the data output by the data transmitting unit;
a bus configured to receive the response by the response receiving unit; and
a two-way bus configured to connect the bus configured to transmit and the bus configured to receive.

3. The data transfer apparatus according to claim 2, further comprising:
a two-way buffer configured to connect the two-way bus and the target; and
a two-way buffer control unit configured to control the two-way buffer.

4. The data transfer apparatus according to claim 3, wherein
the two-way buffer control unit is configured to output a buffer direction signal for controlling a buffer direction of the two-way buffer and an output enable signal for enabling an output of the two-way buffer.

5. The data transfer apparatus according to claim 4, wherein the clock generating unit is configured to generate the second clock by delaying the first clock.

6. The data transfer apparatus according to claim 5, further comprising a setting unit configured to set an initial state of the selector.

7. The data transfer apparatus according to claim 6, wherein the setting unit is configured to respond to a select signal that is output from a memory card I/F.

8. The data transfer apparatus according to claim 7, wherein the setting unit includes a switch unit.

9. The data transfer apparatus according to claim 8, wherein the target is a memory card.

10. A data transfer apparatus comprising:
a clock transmitting unit configured to transmit a first clock to a target for data transfer;
a data transmitting unit configured to transmit in synchronization with the first clock data including a start signal to the target;
a response receiving unit configured to receive from the target a response having therein the start signal and output a first response based on the response received;
a clock generating unit configured to receive the first clock and generate a second clock based on the first clock, wherein the second clock is delayed less than one clock cycle from the first clock;
a response generating unit configured to generate in synchronization with the second clock a second response based on the first response; and
a selector configured to select any one of the first response and the second response depending on a time from transmission of the data by the data transmitting unit to the target until arrival of a response from the target at the response receiving unit.

11. The data transfer apparatus according to claim 10, further comprising:
a bus configured to transmit the data output by the data transmitting unit;
a bus configured to receive the response by the response receiving unit; and
a two-way bus configured to connect the bus configured to transmit and the bus configured to receive.

12. The data transfer apparatus according to claim 11, further comprising:
a two-way buffer configured to connect the two-way bus and the target; and
a two-way buffer control unit configured to control the two-way buffer.

13. The data transfer apparatus according to claim 12, wherein the two-way buffer control unit is configured to output a buffer direction signal for controlling a buffer direction of the two-way buffer and an output enable signal for enabling an output of the two-way buffer.

14. The data transfer apparatus according to claim 13, wherein the clock generating unit is configured to generate the second clock by delaying the first clock.

15. The data transfer apparatus according to claim 14, further comprising a setting unit configured to set an initial state of the selector.

16. The data transfer apparatus according to claim 15, wherein the setting unit is configured to respond to a select signal that is output from a memory card I/F.

17. The data transfer apparatus according to claim 16, wherein the setting unit includes a switch unit.

18. The data transfer apparatus according to claim 17, wherein the target is a memory card.

19. An image forming apparatus comprising a data transfer apparatus, the data transfer apparatus including
a clock transmitting unit configured to transmit a first clock to a target for data transfer that is situated at a distance from the data transfer apparatus;
a data transmitting unit configured to transmit in synchronization with the first clock data including a start signal to the target;
a response receiving unit configured to receive from the target a response having therein the start signal and output a first response based on the response received;
a clock generating unit configured to receive the first clock and generate a second clock based on the first clock, wherein the second clock is delayed less than one clock cycle from the first clock;
a response generating unit configured to generate in synchronization with the second clock a second response based on the first response; and
a selector configured to select any one of the first response and the second response depending on the distance.

20. The image forming apparatus according to claim 19, further comprising:
an operation unit configured to operate the image forming apparatus; and
a memory card I/F in the operation unit, wherein a memory card can be inserted in the memory card I/F.

21. The image forming apparatus according to claim 20, wherein the operation unit is located on a front-side of the image forming apparatus.

22. An image forming apparatus comprising a data transfer apparatus, the data transfer apparatus comprising:
a clock transmitting unit configured to transmit a first clock to a target for data transfer;
a data transmitting unit configured to transmit in synchronization with the first clock data including a start signal to the target;
a response receiving unit configured to receive from the target a response having therein the start signal and output a first response based on the response received;
a clock generating unit configured to receive the first clock and generate a second clock based on the first clock, wherein the second clock is delayed less than one clock cycle from the first clock;

a response generating unit configured to generate in synchronization with the second clock a second response based on the first response; and a selector configured to select any one of the first response and the second response depending on a time from transmission of the data by the data transmitting unit to the target until arrival of a response from the target at the response receiving unit.

23. The image forming apparatus according to claim 22, further comprising:

an operation unit that operates the image forming apparatus; and a memory card I/F in the operation unit, wherein a memory card can be inserted in the memory card I/F.

24. The image forming apparatus according to claim 23, wherein the operation unit is located on a front-side of the image forming apparatus.

25. A data transfer method comprising:

transmitting, in synchronization with a first clock, data including a start signal to a target for data transfer that is situated at a distance from the data transfer apparatus;

receiving from the target a response having therein the start signal and outputting a first response based on the response received;

generating a second clock based on the first clock, wherein the second clock is delayed less than one clock cycle from the first clock;

generating, in synchronization with the second clock, a second response based on the first response; and selecting any one of the first response and the second response depending on the distance.

26. A data transfer method comprising:

transmitting, in synchronization with a first clock, data including a start signal to a target for data transfer;

receiving from the target a response having therein the start signal and outputting a first response based on the response received;

generating a second clock based on the first clock, wherein the second clock is delayed less than one clock cycle from the first clock;

generating, in synchronization with the second clock, a second response based on the first response; and selecting any one of the first response and the second response depending on a time from transmission of the data in the transmitting until reception of the response at the receiving.

27. A computer-readable recording medium for storing therein a computer program that includes instructions which when executed on a computer causes the computer to execute a method comprising:

transmitting, in synchronization with a first clock, data including a start signal to a target for data transfer that is situated at a distance from the data transfer apparatus;

receiving from the target a response having therein the start signal and outputting a first response based on the response received;

generating a second clock based on the first clock, wherein the second clock is delayed less than one clock cycle from the first clock;

generating, in synchronization with the second clock, a second response based on the first response; and selecting any one of the first response and the second response depending on the distance.

28. A computer-readable recording medium for storing therein a computer program that includes instructions which when executed on a computer causes the computer to execute a method comprising:

transmitting, in synchronization with a first clock, data including a start signal to a target for data transfer;

receiving from the target a response having therein the start signal and outputting a first response based on the response received;

generating a second clock based on the first clock, wherein the second clock is delayed less than one clock cycle from the first clock;

generating, in synchronization with the second clock, a second response based on the first response; and selecting any one of the first response and the second response depending on a time from transmission of the data in the transmitting until reception of the response at the receiving.

29. The data transfer apparatus of claim 1, wherein the response generating unit is configured to generate the second response as a time-delayed version of the first response, and a card interface is configured to set a time-delay with a signal that corresponds to the distance.

30. The data transfer apparatus of claim 10, wherein the response generating unit is configured to generate the second response as a time-delayed version of the first response, and a time-delay corresponds to the time from transmission of the data by the data transmitting unit to the target until arrival of the response from the target at the response receiving unit.

31. The image forming apparatus of claim 19, wherein the response generating unit is configured to generate the second response as a time-delayed version of the first response, and a time-delay is set by a signal from a card interface that corresponds to the distance.

32. The image forming apparatus of claim 22, wherein the response generating unit is configured to generate the second response as a time-delayed version of the first response, and a time-delay corresponds to the time from transmission of the data by the data transmitting unit to the target until arrival of the response from the target at the response receiving unit.

33. The data transfer method of claim 25, wherein:

generating the second response includes generating the second response as a time-delayed version of the first response, and setting a time-delay with a signal from a card interface that corresponds to the distance.

34. The data transfer method of claim 26, wherein:

generating the second response includes generating the second response as a time-delayed version of the first response, and a time-delay corresponds to the time from transmission of the data by the data transmitting unit to the target until arrival of the response from the target at the response receiving unit.

* * * * *